(12) United States Patent  
Tsukamoto

(10) Patent No.: US 11,750,202 B2  
(45) Date of Patent: Sep. 5, 2023

(54) SEMICONDUCTOR INTEGRATED CIRCUIT, SEMICONDUCTOR STORAGE DEVICE, MEMORY SYSTEM, AND FREQUENCY GENERATION METHOD

(71) Applicant: Kioxia Corporation, Tokyo (JP)

(72) Inventor: Takayuki Tsukamoto, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/683,016

(22) Filed: Feb. 28, 2022

(65) Prior Publication Data

US 2022/0416795 A1    Dec. 29, 2022

(30) Foreign Application Priority Data

Jun. 23, 2021    (JP) .................................. 2021-104232

(51) Int. Cl.
| | | |
|---|---|---|
| H03L 7/099 | (2006.01) | |
| H03K 3/03 | (2006.01) | |
| H03K 5/151 | (2006.01) | |
| H03K 17/687 | (2006.01) | |
| G11C 11/4074 | (2006.01) | |
| H03L 7/18 | (2006.01) | |

(52) U.S. Cl.
CPC ........ H03L 7/0995 (2013.01); G11C 11/4074 (2013.01); H03K 3/0315 (2013.01); H03K 5/151 (2013.01); H03K 17/687 (2013.01); H03L 7/18 (2013.01)

(58) Field of Classification Search
None
See application file for complete search history.

(56) References Cited

U.S. PATENT DOCUMENTS

| | | | | |
|---|---|---|---|---|
| 5,608,357 A | * | 3/1997 | Ta .......................... | H03L 7/0995 |
| | | | | 375/372 |
| 5,834,980 A | * | 11/1998 | Pitio ....................... | H04L 7/033 |
| | | | | 331/49 |
| 6,259,326 B1 | * | 7/2001 | Dunlop .................. | H03L 7/0995 |
| | | | | 375/376 |
| 7,439,816 B1 | | 10/2008 | Lombaard | |
| 8,228,126 B2 | * | 7/2012 | Liang ...................... | H04L 7/033 |
| | | | | 331/172 |
| 8,362,848 B2 | * | 1/2013 | Raghunathan ........ | H03L 7/0995 |
| | | | | 327/158 |
| 8,847,691 B2 | * | 9/2014 | Zhu ........................ | H04L 7/0338 |
| | | | | 327/158 |

(Continued)

FOREIGN PATENT DOCUMENTS

JP    2015-504635 A    2/2015

*Primary Examiner* — Kenneth B Wells
(74) *Attorney, Agent, or Firm* — Foley & Lardner LLP

(57) ABSTRACT

A semiconductor integrated circuit includes a first oscillator configured to generate a first signal with a first frequency based on a control signal and output the first signal to a path. The semiconductor integrated circuit includes a control signal generation circuit operatively coupled to the first oscillator via the path, and configured to receive the first signal from the first oscillator via the path and generate the control signal. The semiconductor integrated circuit includes a second oscillator configured to generate a second signal with a second frequency based on the control signal and output the second signal to an output terminal outside the path.

16 Claims, 18 Drawing Sheets

(56) References Cited

U.S. PATENT DOCUMENTS

| | | | |
|---|---|---|---|
| 11,356,107 B1* | 6/2022 | Bhat | ........................ H03L 7/093 |
| 2012/0154066 A1* | 6/2012 | Kubota | ...................... H03L 5/00 |
| | | | 331/116 FE |
| 2017/0093334 A1* | 3/2017 | Takada | .................... H03L 7/093 |
| 2019/0363674 A1 | 11/2019 | Pandita et al. | |
| 2022/0321109 A1* | 10/2022 | Kim | ................... H03K 17/6872 |

* cited by examiner

SEMICONDUCTOR INTEGRATED CIRCUIT, SEMICONDUCTOR STORAGE DEVICE, MEMORY SYSTEM, AND FREQUENCY GENERATION METHOD

CROSS-REFERENCE TO RELATED APPLICATION

This application is based upon and claims the benefit of priority from Japanese Patent Application No. 2021-104232, filed Jun. 23, 2021, the entire contents of which are incorporated herein by reference.

FIELD

Embodiments described herein relate generally to a semiconductor integrated circuit, a semiconductor storage device, a memory system, and a frequency generation method.

BACKGROUND

In communication systems, communication speeds can be accelerated by increasing operation frequencies or making the operation frequencies variable. For example, in interface circuits or the like of memory systems in which semiconductor storage devices such as semiconductor memories are adopted, high-speed writing and reading for data can be achieved through varying the operation frequencies.

However, changing signal frequencies can take relatively long time, which makes it challenging to effectively accelerate communication speeds of systems.

DETAILED DESCRIPTION

Embodiments provide a semiconductor integrated circuit, a semiconductor storage device, a memory system, and a frequency generation method capable of changing a signal frequency in a relatively short time.

In general, according to one embodiment, a semiconductor integrated circuit includes a first oscillator configured to generate a first signal with a first frequency based on a control signal and output the first signal to a path. The semiconductor integrated circuit includes a control signal generation circuit operatively coupled to the first oscillator via the path, and configured to receive the first signal from the first oscillator via the path and generate the control signal. The semiconductor integrated circuit includes a second oscillator configured to generate a second signal with a second frequency based on the control signal and output the second signal to an output terminal outside the path.

Hereinafter, embodiments will be described in detail with reference to the drawings.

In a semiconductor integrated circuit according to an embodiment, a signal generation circuit that oscillates at a stable frequency by a feedback loop is adopted and a frequency can be changed in a relatively short time by changing an output frequency with a circuit that does not form a feedback loop using a signal generated by the signal generation circuit. In the embodiment, an example applied to a clock generation circuit will be described, but may also be applied to an interface circuit or a phase locked loop (PLL) circuit using the clock generation circuit. In the embodiment, as an interface circuit, an example applied to an interface circuit which is adopted in a memory system will be described, but may be applied to another interface circuit or may be applied to a circuit other than an interface circuit.

(Acceleration)

Figure 3:
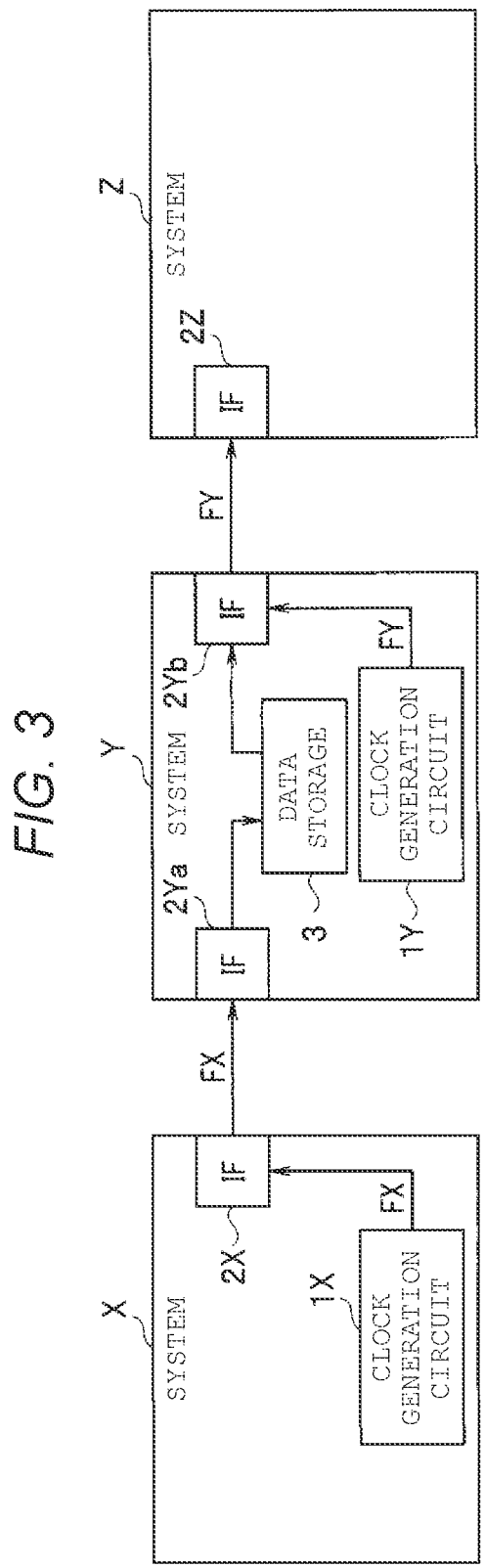
FIG. 3 is a block diagram illustrating a configuration of a communication system.
Figure 4:
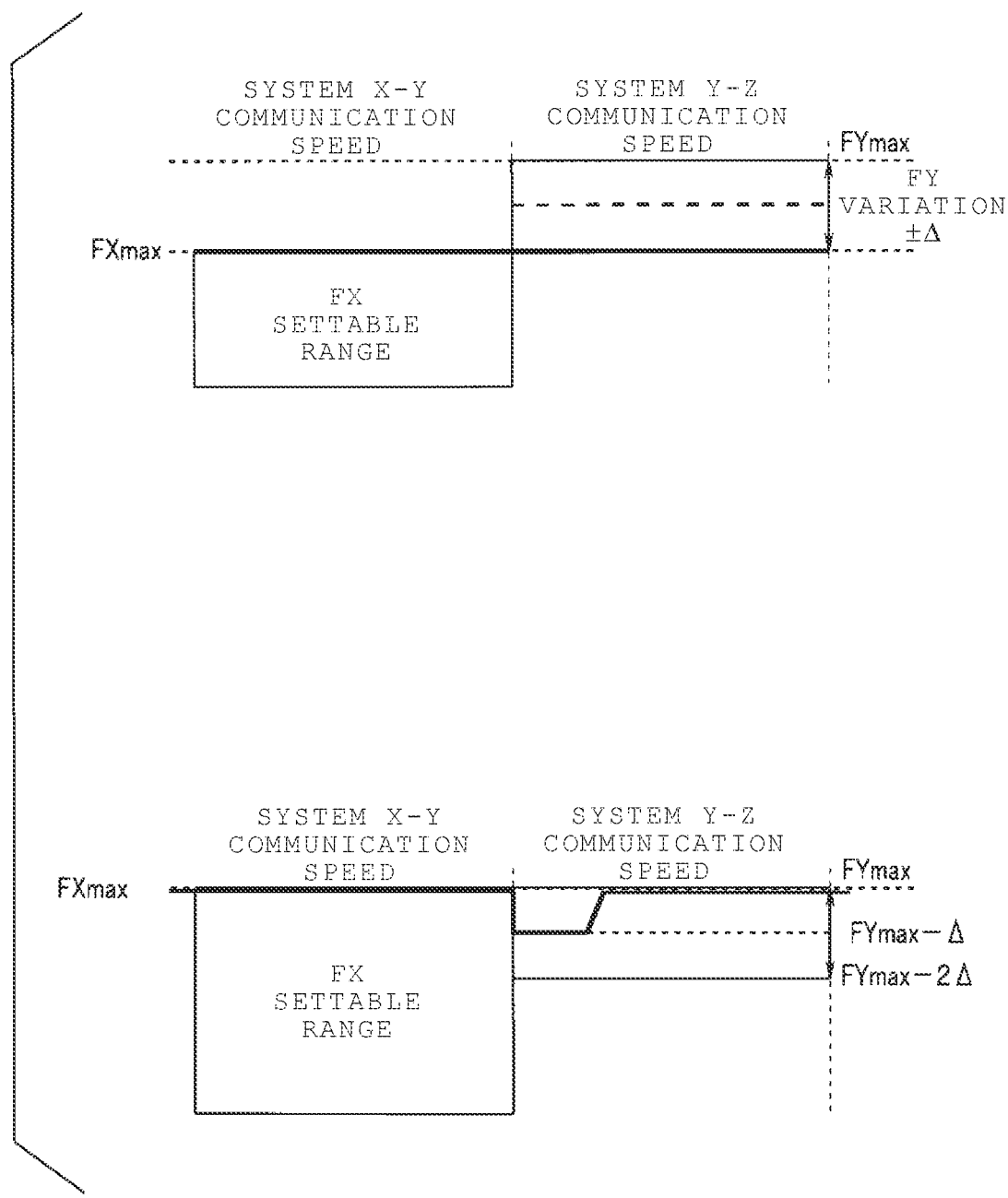
FIG. 4 is a diagram illustrating acceleration of a communication speed for setting an optimum frequency for a system by making a frequency variable.

FIGS. 3 and 4 are diagrams illustrating acceleration of a communication speed by making a frequency variable and setting an optimum frequency for a system. FIG. 3 is a block diagram illustrating a configuration of a communication system and FIG. 4 is a diagram illustrating a communication speed (a communication frequency) in the communication system of FIG. 3.

In FIGS. 3 and 4, it is assumed that data is transferred from a system X to a system Y and data is further transferred from the system Y to a system Z.

In FIG. 3, the system X includes a clock generation circuit 1X and an interface circuit (hereinafter referred to as an I/F circuit) 2X. The clock generation circuit 1X generates a clock as an output signal and gives the clock to the I/F circuit 2X. The I/F circuit 2X transfers the data transmitted from the system X to the system Y in synchronization with the clock generated by the clock generation circuit 1X.

The system Y includes a clock generation circuit 1Y, I/F circuits 2Ya and 2Yb, and a data storage 3. The I/F circuit 2Ya receives data from the I/F circuit 2X and gives the data to the data storage 3 to store the data. The clock generation circuit 1Y generates a clock as an output signal and gives the clock to the I/F circuit 2Yb. The I/F circuit 2Yb transmits the data read from the data storage 3 to the system Z in synchronization with the clock generated by the clock generation circuit 1Y. The system Z includes an I/F circuit 2Z and the I/F circuit 2Z receives data from the I/F circuit 2Yb.

A maximum operation frequency between the systems Y and Z is determined using a maximum operation frequency of the I/F circuit 2Yb of the system Y and a maximum operation frequency of the I/F circuit 2Z of the system Z. Here, FX is a frequency (a clock frequency) of the output signal of the clock generation circuit 1X and FY is a frequency (a clock frequency) of the output signal of the clock generation circuit 1Y. In data transfer from the system X to the system Y, a frequency is synchronized with a clock of FX. In data transfer performed from the system Y to the system Z, a frequency is synchronized with a clock of FY. An actual communication frequency between the systems Y and Z is limited by the output (clock) frequency FY of the clock generation circuit 1Y.

It is assumed that FY<FX is satisfied, that is, a data amount sent from the system X to the system Y is greater than a data amount sent from the system Y to the system Z for a given time. Here, assuming that a bus width between the I/F circuit 2X and the I/F circuit 2Ya is the same as a bus width between the I/F circuit 2Yb and the I/F circuit 2Z, communication can be established when all the differences between data amounts received by the system Y and data amounts transmitted by the system Y can be stored into the data storage 3 during a communication period. However, when the capacity of the data storage 3 is small, the communication cannot be established due to overflow of the data storage 3 depending on a difference in transmitted or received data amount. When a small capacity of the data storage 3 is considered to reduce a chip area of the system Y, it is necessary to satisfy FY≥FX basically.

FIG. 4 is a diagram illustrating a relation between FX and FY, and a communication speed of the whole communication system. The upper part of FIG. 4 illustrates an example in which FY is fixed and the lower part of FIG. 4 illustrates an example in which FY is variable. In FIG. 4, the vertical axis represents a communication speed, the left side indicates a communication speed between the systems X and Y, and the right side indicates a communication speed between the systems Y and Z.

(Case of Fixed FY)

Here, FYmax is a maximum value of the clock frequency FY which can be generated by the clock generation circuit 1Y. That is, FYmax is a maximum communication frequency at which a theoretical maximum value of a communication speed from the system Y to the system Z can be achieved. FY varies by ±A [Hz] under the influence of temperature, a power supply voltage change, a manufacturing process, or trimming accuracy. Accordingly, a highest frequency which can be generated by the clock generation circuit 1Y is set with FYmax−Δ (indicated by a right dotted line in the upper part of FIG. 4). A maximum value of a communication frequency available in actual communication from the system Y to the system Z is FYmax−2Δ (indicated by a thick line).

When FY≥FX is satisfied, a communicable maximum frequency FXmax allowed in the whole system is limited to FXmax≤FYmax−2Δ although the frequency FX which can be generated by the clock generation circuit 1X is higher than the frequency FY which can be generated by the clock generation circuit 1Y.

(Case of Variable FY)

For example, it is assumed that since a clock frequency (output frequency) of the clock generation circuit 1Y is FYmax−Δ and an output frequency FX of the clock generation circuit 1X is FXmax≤FYmax−Δ, the frequency of FX is increased and is changed to FX>FYmax−Δ. In the lower part of FIG. 4, a post-change in the frequency is assumed. Here, the data transfer is possible by increasing FY with the change in FX. A level change in a Y-Z communication speed indicated by a thick line indicates the change in FY. Here, the communicable maximum frequency FXmax allowed in the whole system is FXmax=FYmax by changing the output clock frequency of the clock generation circuit 1X is changed to FYmax. As such, by making FY variable, it is possible to increase the communicable maximum frequency allowed in the whole system.

Incidentally, in the example of the lower part of FIG. 4, for a period until the output frequency of the clock generation circuit 1Y is changed from FYmax−Δ to FYmax, a data amount according to a frequency difference between FX and FY is stored into the data storage 3. When FY is not changed to FYmax before overflow of the data storage 3, communication cannot be established. That is, to establish communication, it is necessary to sufficiently shorten a time taken to switch the frequency so that the data storage 3 with a small capacity is not overflown.

Comparative Example of Clock Generation Circuit

Figure 5:
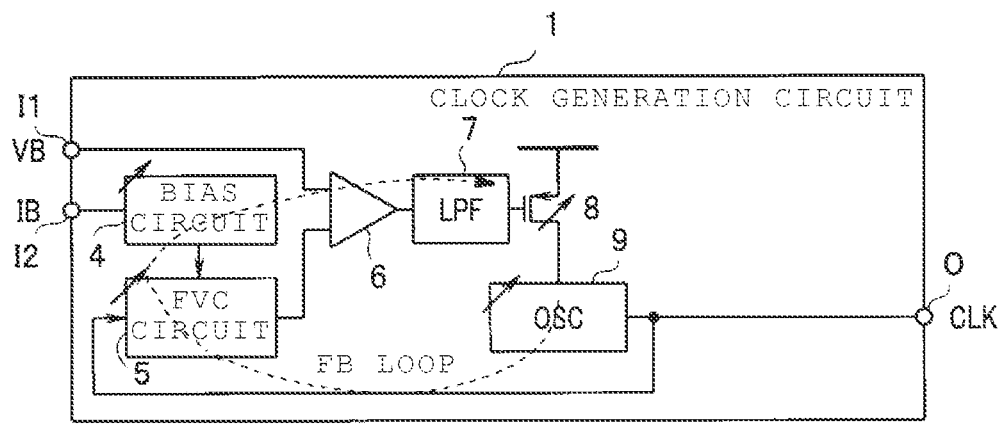
FIG. 5 is a block diagram illustrating a comparative example of a clock generation circuit.

FIG. 5 is a block diagram illustrating a comparative example of a clock generation circuit.

In FIG. 5, the clock generation circuit 1 includes a bias circuit 4, a frequency voltage conversion (FVC) circuit 5, an amplifier 6, a low pass filter (LPF) 7, a voltage current conversion (VIC) circuit 8, and an oscillator (OSC) 9. A reference voltage VB and a reference current IB are supplied to terminals I1 and I2 of the clock generation circuit 1, respectively.

The bias circuit 4 generates a bias current corresponding to the reference current IB supplied to the terminal I2 and supplies the generated bias current to the FVC circuit 5. The FVC circuit 5 converts a frequency of an oscillation output from the OSC 9 to be described below into a voltage using the bias current from the bias circuit 4 and outputs the voltage obtained through the conversion to the amplifier 6. The FVC circuit 5 may be configured using, for example, a capacitor (not illustrated). For example, the FVC circuit 5 may charge or discharge a capacitor using the bias current supplied from the bias circuit 4 for a period according to an output of the OSC 9 and may output a terminal voltage of the capacitor as a voltage conversion result.

The reference voltage VB from the terminal I1 is given to the amplifier 6. The amplifier 6 outputs a difference between the reference voltage VB and an output voltage of the FVC circuit 5 to the LPF 7. The LPF 7 averages an output of the amplifier 6 and supplies the averaged value to the VIC circuit 8. The VIC circuit 8 serving as a first current source is connected to a power supply line supplying a power supply voltage and converts an output voltage of the LPF 7 into a current to supply the current to the OSC 9. The VIC circuit 8 may be configured with, for example, a PMOS transistor in which a source is connected to the power supply line, an output of the LPF 7 is applied to a gate, and a drain is connected to the OSC 9.

The OSC 9 serving as a first oscillator may be configured with, for example, a ring oscillator. The OSC 9 oscillates at a frequency according to the input current and outputs a clock (CLK) as an output signal from an output terminal O. The OSC 9 feeds the generated clock back to the FVC circuit 5.

When the frequency of the output clock of the OSC 9 is higher than a reference frequency corresponding to the reference voltage VB, an output voltage of the FVC circuit 5 becomes higher than the reference voltage VB and an output voltage of the amplifier 6 increases. As a result, a current supplied from the VIC circuit 8 to the OSC 9 decreases and the frequency of the output clock of the OSC 9 is lowered.

Conversely, when the frequency of the output clock of the OSC 9 is lower than the reference frequency corresponding to the reference voltage VB, the output voltage of the FVC circuit 5 becomes lower than the reference voltage VB and the output voltage of the amplifier 6 decreases. As a result, a current supplied from the VIC circuit 8 to the OSC 9 increases and the frequency of the output clock of the OSC 9 increases. As such, the output clock frequency of the OSC 9 matches the reference frequency corresponding to the reference voltage VB.

In this way, the clock generation circuit 1 includes a feedback (FB) loop (indicated by a dotted arrow) configured with the bias circuit 4, the FVC circuit 5, the amplifier 6, the LPF 7, the VIC circuit 8, and the OSC 9. With the FB loop, the output clock frequency of the OSC 9 converges to a regular frequency. That is, once the FB loop is locked (stabilized), the output clock frequency can be maintained to the regular frequency although a change in the power supply voltage, a change in temperature, or the like occurs.

Incidentally, to change the output clock frequency of the clock generation circuit 1, it is necessary to change setting of the reference voltage VB or the reference current IB related to the FB loop or change circuit setting of the bias circuit 4, the FVC circuit 5, the VIC circuit 8, or the OSC 9 indicated by an oblique arrow in FIG. 4. For example, the output clock frequency can be changed by changing the number of connected PMOS transistors using the plurality of PMOS transistors in the VIC circuit 8. For example, in the OSC 9, the output clock frequency can be changed by changing the number of stages of an inverter included in the ring oscillator.

However, due to such setting change, disturbance is caused in the stably operating FB loop, and thus the FB loop becomes unstable. The FB loop has a loop bandwidth limited by the LPF 7 to enable stable loop control, and thus a relatively long time is necessary to stabilize the unstable FB loop again. As a result, after the setting is changed to change the clock frequency of the clock generation circuit 1, a relatively long time is necessary until the clock frequency of the clock generation circuit 1 becomes stable at a desired frequency.

Figure 6:
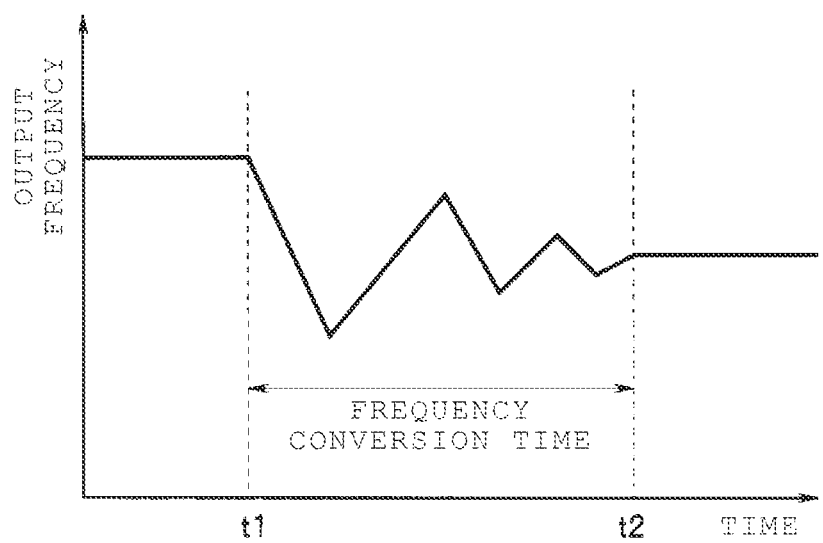
FIG. 6 is a diagram illustrating a waveform indicating a change in an output frequency at the time of changing of a frequency in the comparative example.

FIG. 6 is a diagram illustrating a waveform when the horizontal axis represents a time and the vertical axis represents an output frequency. As illustrated in FIG. 6, when setting change is performed to change the output frequency at a timing t1, the FB loop becomes unstable and the output frequency is changed and reaches the desired frequency at a timing t2 after a relatively long time.

Accordingly, in the example of FIGS. 3 and 4, when a clock generation circuit 1Y that has a configuration similar to that of the clock generation circuit 1 is adopted, a relatively long time FX>FY is satisfied after the frequency change. Therefore, in the system of FIGS. 3 and 4, when a communicable maximum frequency allowable in the system is raised, it is necessary to sufficiently increase the capacity of the data storage 3.

It is conceivable that, two systems of circuits similar to that of a comparative example of FIG. 5 are prepared, one of the circuits is used to detect a setting value and the other circuit is used to output a clock so that a setting value detected by the one circuit is set with the other circuit. Here, however, a relatively long time is necessary until the FB loop of the other circuit is stabilized when the frequency is changed.

(Configuration)

Accordingly, in the embodiment, a circuit in which the FB loop is adopted and an output clock is generated without having an influence of the FB loop is adopted.

Figure 1:
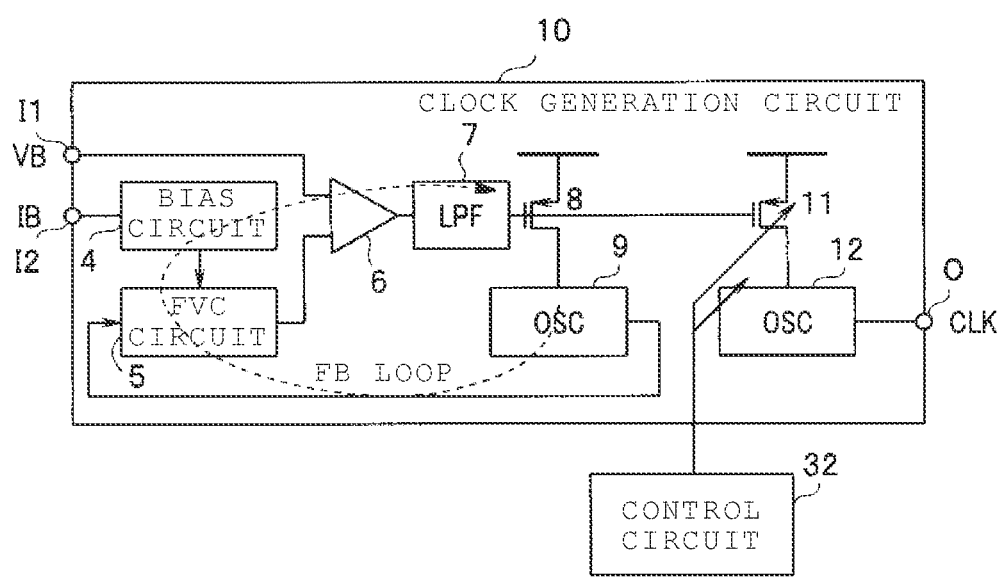
FIG. 1 is a block diagram illustrating a clock generation circuit configured with a semiconductor integrated circuit according to an embodiment.
Figure 2:
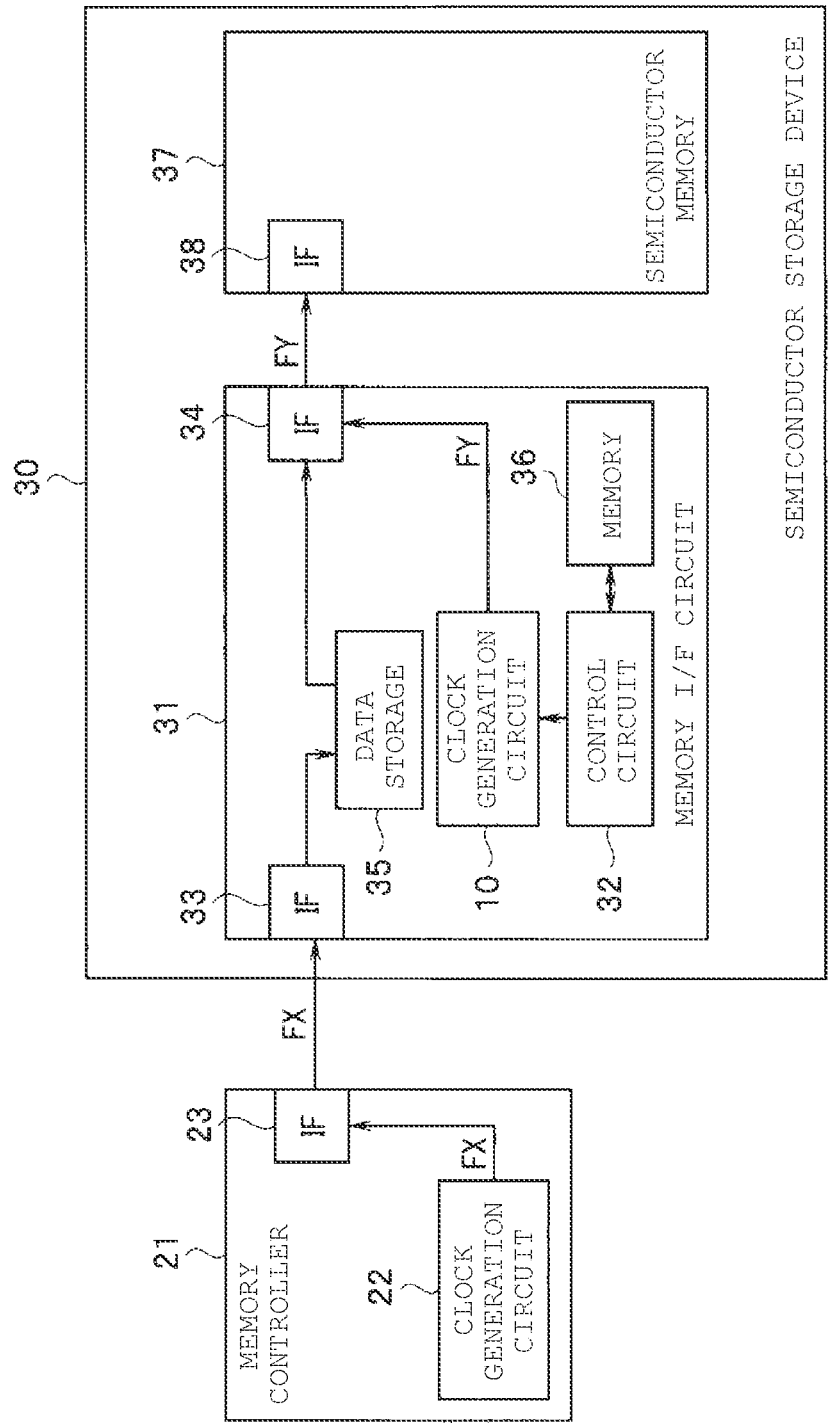
FIG. 2 is a block diagram illustrating a memory system including the semiconductor integrated circuit in FIG. 1.

FIG. 1 is a block diagram illustrating a clock generation circuit included a semiconductor integrated circuit according to the embodiment. FIG. 2 is a block diagram illustrating a memory system including the semiconductor integrated circuit of FIG. 1.

The memory system in FIG. 2 includes a memory controller 21 and a semiconductor storage device 30. The semiconductor storage device 30 includes a memory interface (I/F) circuit 31 and a semiconductor memory 37. The memory controller 21 is equivalent to the system X of FIG. 3, the memory I/F circuit 31 is equivalent to the system Y, the semiconductor memory 37 is equivalent to the system Z. The data transfer illustrated in FIGS. 3 and 4 is equivalent to, for example, a case where data from the memory controller 21 is stored in the semiconductor memory 37.

(Configuration of Memory System)

The memory controller 21 and the semiconductor memory 37 are connected by the memory I/F circuit 31. The memory I/F circuit 31 and the semiconductor memory 37 are packaged as a semiconductor storage device 30. FIG. 1 illustrates an example in which one memory I/F circuit 31 and one semiconductor memory 37 are provided in the semiconductor storage device 30. However, m (where m is an integer equal to or greater than 2) semiconductor memories 37 may be provided in one memory I/F circuit 31, and n (where n is an integer equal to or greater than 2) memory I/F circuits 31 may be provided in one memory controller 21.

For example, multiple power supplies of 1.2 V, 1.8 V, and 3.3 V are adopted as the memory controller 21 in some cases. On the other hand, for example, a power supply of 1.2 V is adopted in the semiconductor memory 37 in some cases. Even here, by adopting the memory I/F circuit 31, data transfer is enabled between the memory controller 21 and the semiconductor memory 37 irrespective of a difference in the power supply voltage. For example, when the memory controller 21 and the semiconductor memory 37 adopt different protocols, the memory I/F circuit 31 enables valid data transfer.

The memory system may be connected to a host (not illustrated). The host is, for example, an electronic device such as a personal computer, a mobile terminal, an in-vehicle device, or a server. In response to a request from the host, the memory system stores user data from the host (hereinafter simply referred to as data) into each semiconductor memory 37 or reads data stored in each semiconductor memory 37 and outputs the data to the host. Specifically, the memory system can write data to each semiconductor memory 37 in response to a write request from the host and can read data from each semiconductor memory 37 in response to a read request from the host.

The memory system may be a universal flash storage (UFS) device or the like configured as one package of the memory controller 21, the plurality of memory I/F circuits 31, and the semiconductor memory 37 or may be a solid state drive (SSD) or the like.

As illustrated in FIG. 2, the memory controller 21 controls writing of data to the semiconductor memory 37 in response to a data write request from the host. The memory controller 21 controls reading of data from the semiconductor memory 37 in response to a read request from the host. The memory controller 21 may control writing and reading of data to and from the semiconductor memory 37 spontaneously rather than a request from the host.

The host and the memory controller 21 are connected via a predetermined interface. For example, as the interface, any of various interfaces such as an embedded multimedia card (eMMC) parallel interface, a peripheral component interconnect-express (PCIe) serial extension interface, and an M-PHY high-speed serial interface.

The memory controller 21 includes a central processing unit (CPU) (not illustrated) and controls a process of writing user data or the like to each semiconductor memory 37 and a process of reading user data from each semiconductor memory 37 based on instructions from the CPU. When a request is received from the host, the CPU of the memory controller 21 performs control in response to the request. For example, the CPU of the memory controller 21 instructs the memory I/F circuit 31 to write user data to each semiconductor memory 37 in response to a request from the host. The CPU of the memory controller 21 instructs the memory I/F circuit 31 to read user data from each semiconductor memory 37 in response to a request from the host.

In FIG. 2, the memory controller 21 includes the clock generation circuit 22 and the I/F circuit 23 that have the same configurations as the clock generation circuit 1X and the I/F circuit 2X in FIG. 3, respectively. The memory I/F circuit 31 includes I/F circuits 33 and 34 and a data storage 35 that have same configurations as the I/F circuits 2Ya and 2Yb and the data storage 3 in FIG. 3, respectively. The semiconductor memory 37 includes an I/F circuit 38 that has the same configuration as the I/F circuit 2Z in FIG. 3.

In the embodiment, in the memory I/F circuit 31, the clock generation circuit 10 illustrated in FIG. 1 is adopted as the clock generation circuit 1Y in FIG. 3. The memory I/F circuit 31 includes a control circuit 32 and a memory 36 that enables setting change of the clock generation circuit 10. The control circuit 32 may be configured with a processor including a CPU, a field programmable gate array (FPGA), or the like, may operate to control each unit according to a program stored in a memory (not illustrated), or may implement some or all of the functions of hardware electronic circuits.

When the clock frequency generated by the clock generation circuit 22 is set as FX and the clock frequency generated by the clock generation circuit 10 is set as FY, the control circuit 32 controls a frequency of an output clock of the clock generation circuit 10 so that the frequency FY of the output clock of the clock generation circuit 10 satisfies FX≤FY. The clock generation circuit 10 in the embodiment can change FY to a frequency corresponding to FX in a considerably short time from the change in the frequency FX.

(Clock Generation Circuit)

Next, a configuration of the clock generation circuit 10 will be described with reference to FIG. 1. In FIG. 1, the same reference numerals are given to the same elements as those of FIG. 5 and repeated description of the same configurations will be omitted.

The clock generation circuit 10 includes the bias circuit 4, the FVC circuit 5, the amplifier 6, the LPF 7, the VIC circuit 8, and the OSC 9. Terminals I1 and I2 of the clock generation circuit 1 are supplied with the reference voltage VB and the reference current IB, respectively. In the clock generation circuit 10, the bias circuit 4, the FVC circuit 5, the amplifier 6, the LPF 7, the VIC circuit 8, and the OSC 9 form an FB loop. The bias circuit 4, the FVC circuit 5, the amplifier 6, and the LPF 7 form a control signal generation circuit.

In the embodiment, an oscillation clock from the OSC 9 is fed back to the FVC circuit 5, but is not output to the output terminal O.

In the embodiment, the clock generation circuit 10 includes a VIC circuit 11 and an OSC 12 which do not form the FB loop in addition to such circuits forming the FB loop. An output of the LPF 7 is given to the VIC circuit 11. The VIC circuit 11 serving as a second current source is connected to a power supply line supplying a power supply voltage and converts an output voltage of the LPF 7 which is a control signal of the FB loop into a current to supply the current to the OSC 12. The VIC circuit 11 may be configured with, for example, one or more PMOS transistors in which a source is connected to the power supply line, an output of the LPF 7 is applied to a gate, and a drain is connected to the OSC 12. The OSC 12 serving as a second oscillator may be configured with, for example, a ring oscillator. The OSC 12 oscillates at a frequency according to the input current and outputs a clock (CLK) as an output signal from an output terminal O. The OSC 12 does not form the FB loop and an output of the OSC 12 is not fed back to the FVC circuit 5.

The VIC circuit 11 may be configured to be able to change conversion characteristics of voltage-current conversion. For example, by configuring the VIC circuit 11 with a plurality of PMOS transistors and changing the number of PMOS transistors used for voltage-current conversion, the conversion characteristics of voltage-current conversion may be able to be changed. For example, by providing a switch between the source of each PMOS transistor and the power supply line and between the drain and the OSC 12 to control the number of switches to be turned on, it is possible to change the conversion characteristics of voltage-current conversion.

The OSC 12 may be configured to be able to change conversion characteristics of current-frequency conversion. For example, when the OSC 12 is configured with a ring oscillator of a plurality of inverters, the number of stages of connected inverters may be configured to be changeable or capacities of the capacitors included in the ring oscillator may be changeable, so that the conversion characteristics of voltage-current conversion can be changed.

In the embodiment, when an output clock frequency is changed, the setting of the reference voltage VB, the reference current IB, the bias circuit 4, the FVC circuit 5, the VIC circuit 8, and the OSC 9 having an influence on the FB loop is not changed and setting of at least one of the VIC circuit 11 and the OSC 12 which do not form the FB loop is changed. Since the feedback control is not performed using an output of the OSC 12, disturbance is not given to the FB loop despite a change in the setting of at least one of the VIC circuit 11 and the OSC 12.

The control circuit 32 changes a frequency of an output clock from the OSC 12 by changing the setting of at least one of the VIC circuit 11 and the OSC 12. Setting information for setting FY is stored in the memory 36. The control circuit 32 reads the setting information from the memory 36 and changes the setting of at least one of the VIC circuit 11 and the OSC 12 based on the read setting information. For example, the control circuit 32 may request setting information at the time of obtaining the frequency for each output clock frequency from the OSC 12 while changing the setting of at least one of the VIC circuit 11 and the OSC 12 and may store the requested setting information in advance into the memory 36.

In the embodiment, the VIC circuits 8 and 11 are configured to obtain the same characteristics. For example, the VIC circuits 8 and 11 are configured at positions near a layout of the semiconductor integrated circuit. The OSC 9 and the OSC 12 are configured to obtain the same characteristics. For example, the OSC 9 and the OSC 12 are configured at positions near the layout of the semiconductor integrated circuit. Thus, when a variation or the like in temperature or the power supply voltage occurs, it is conceivable that the same change in the characteristics occurs in the VIC circuits 8 and 11 and the same change in the characteristics occurs in the OSC 9 and the OSC 12. Accordingly, when a desired frequency is obtained from the OSC 9 irrespective of the change or the like in temperature or the power supply voltage by loop control of the FB loop, it is conceivable that the desired frequency is also obtained irrespective of the change or the like in temperature or the power supply voltage from the OSC 12.

Figure 7:
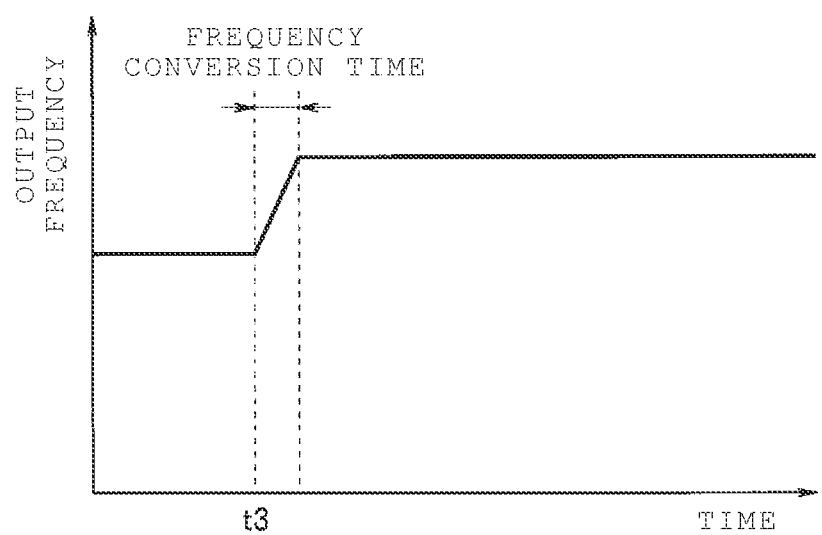
FIG. 7 is a diagram illustrating a waveform indicating a change in an output frequency at the time of changing of a frequency according to the embodiment.

Next, an operation of the embodiment in such a configuration will be described with reference to FIG. 7. FIG. 7 is a diagram illustrating a waveform indicating a change in an output frequency at the time of changing of a frequency when the horizontal axis represents a time and the vertical axis represents an output frequency.

When power is supplied, the OSC 9 of the clock generation circuit 10 starts oscillating at a certain frequency. The bias circuit 4 supplies a current corresponding to the reference current IB input via the input terminal I1, for example, a multiplied current, to the FVC circuit 5. The FVC circuit 5 converts the frequency of the output of the OSC 9 using the reference current IB into a voltage and outputs the voltage to the amplifier 6. The amplifier 6 outputs a voltage according to a difference between the output voltage of the FVC circuit 5 and the reference voltage VB input via the input terminal I2 to the LPF 7. The LPF 7 averages the output of the amplifier 6 and gives the averaged value to the VIC circuit 8. The VIC circuit 8 supplies a current based on the output of the LPF 7 to the OSC 9. In this way, the OSC 9 generates a clock of a frequency according to the current from the LPF 7. With the FB loop, the frequency of the clock generated by the OSC 9 converges to the desired frequency.

In the embodiment, the output of the LPF 7 is supplied not only to the VIC circuit 8 but also to the VIC circuit 11. When the characteristics of the VIC circuit 8 and the VIC circuit 11 are matched, the VIC circuit 11 supplies the OSC 12 with a current similar to a current supplied to the OSC 9 by the VIC circuit 8. When characteristics of the SOC 9 and the OSC 12 are matched, the OSC 12 generates the clock of the same frequency as that of the OSC 9. The OSC 12 outputs the generated clock (CLK) from the output terminal O. An output signal of the OSC 12 is supplied as an output of the clock generation circuit 10 to the I/F circuit 34.

In a state in which the output of the clock generation circuit 10 is stable, data transfer starts between the memory controller 21 and the semiconductor memory 37. That is, the clock generation circuit 22 of the memory controller 21 generates a clock with a frequency FX and gives the clock to the I/F circuit 23. The I/F circuit 23 transmits the data from the memory controller 21 to the memory I/F circuit 31 in synchronization with the clock generated by the clock generation circuit 22.

The I/F circuit 33 of the memory I/F circuit 31 receives the data from the I/F circuit 23 and gives the data to the data storage 35. The data storage 35 outputs the data received by the I/F circuit 33 to the I/F circuit 34 while storing the data. The clock with the frequency FY from the clock generation circuit 10 is given to the I/F circuit 34, and the I/F circuit outputs the data read from the data storage 35 to the semiconductor memory 37 in synchronization with the clock. The I/F circuit 38 of the semiconductor memory 37 receives the data transferred from the I/F circuit 34.

In the data transfer, FX≤FY is set and data from the memory controller 21 is reliably transferred to the semiconductor memory 37. For example, even if a change in the power supply voltage, a change in temperature, or the like occurs, a change in the clock frequency of the OSC 9 is small with the FB loop forming the clock generation circuit 10, and the OSC 9 continues to output a clock with a substantially desired frequency. The VIC circuit 11 supplies a current according to the output of the LPF 7 to the OSC 12, and the OSC similarly continues to output the clock with the desired frequency as in the OSC 9.

Here, it is assumed that the frequency FX of the clock generated by the clock generation circuit 22 is changed and becomes a frequency higher than FY before the change. Information regarding the frequency FX of the clock generated by the clock generation circuit 22 is given to the control circuit 32, and thus when FX is changed, the control circuit 32 changes a setting value of the clock generation circuit 10 so that the frequency of the clock generated by the clock generation circuit 10 is raised with the change in FX.

That is, the control circuit 32 changes the frequency of the clock generated by the OSC 12 by changing the setting of at least one of the VIC circuit 11 and the OSC 12 provided in the clock generation circuit 10. Although the VIC circuit 11 and the OSC 12 do not form the FB loop and the setting values of the VIC circuit 11 and the OSC 12 are changed, disturbance does not occur in the FB loop and the frequency of the clock from the OSC 12 is changed to the desired frequency in a sufficiently short time. For example, in the clock generation circuit according to the comparative example, about several μ seconds are taken due to the bandwidth limitation of the FB loop until the frequency is changed and the frequency is stabilized to the desired frequency. However, in the clock generation circuit 10 according to the embodiment, a time necessary from the start of the change in the frequency to the stabilization of the frequency to the desired frequency is assumed to be about several n seconds to tens of n seconds.

FIG. 7 illustrates such state. When the setting of at least one of the VIC circuit 11 and the OSC 12 is changed at a timing t3, an output frequency of the OSC 12 reaches the desired frequency after a frequency conversion time which is a relatively short time.

As a result, when an increase in a data amount of data which will be stored in the data storage 35 is relatively small, and when the data storage 35 with a relatively small capacity is adopted, data communication from the memory controller 21 to the semiconductor memory 37 can continue.

As such, according to the embodiment, the signal with the stable frequency can be generated using the feedback loop, the output frequency is changed using an oscillator which does not give disturbance to the feedback loop without forming the feedback loop, and thus the frequency can be changed in a relatively short time (at a high speed) irrespective of the loop bandwidth of the feedback loop. As a result, when the clock generation circuit of the interface circuit relaying data is used in the embodiment, it is possible maximize the communicable maximum frequency by changing the frequency and it is also possible to reduce a capacity of a buffer storing data by a difference in a transferred data amount according to a difference in a communication frequency.

Second Embodiment

Figure 8:
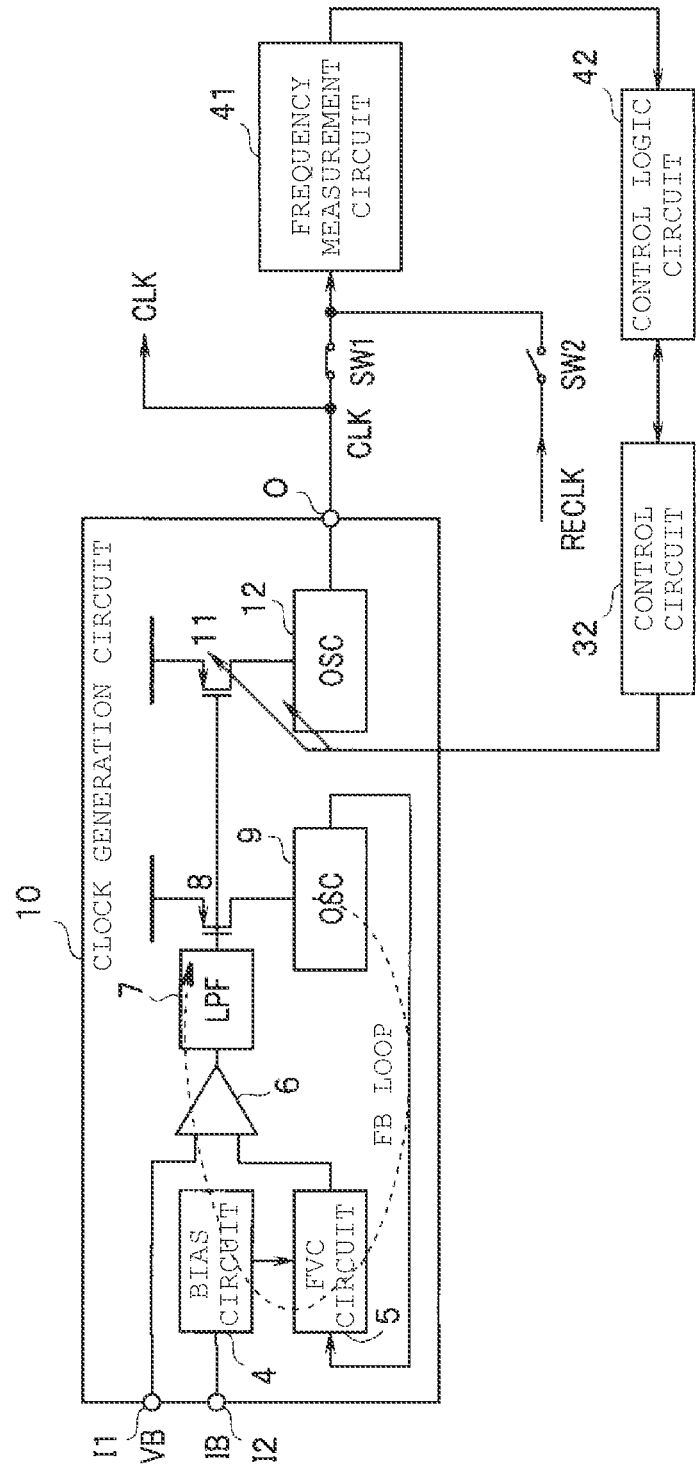
FIG. 8 is a block diagram according to a second embodiment.

FIG. 8 is a block diagram illustrating a second embodiment. In FIG. 8, the same reference numerals are given to the same elements as those of FIG. 1 and description thereof will be omitted. In the embodiment, a frequency can be accurately changed to a desired frequency when the frequency is changed.

In the first embodiment, to generate a clock with the desired frequency after the change in the frequency, setting information for setting at least one of the VIC circuit 11 and the OSC 12 is assumed to be stored in the memory 36, as described above. In the embodiment, according to a desired frequency, setting information for setting at least one of the VIC circuit 11 and the OSC 12 can be acquired in sequence at the time of changing of the frequency.

An embodiment of FIG. 8 is different from the embodiment of FIG. 1 in that a frequency measurement circuit 41, a control logic circuit 42, and switches SW1 and SW2 are added. A clock (CLK) appearing at the output terminal O is output as an output signal and is also supplied to the frequency measurement circuit 41 via the switch SW1. A reference clock RECLK is also input to the frequency measurement circuit 41 via the switch SW2. The frequency measurement circuit 41 is controlled (not illustrated) by the control circuit 32 such that the frequency or period of the clock CLK input via the switch SW1 and a frequency or period of the reference clock RECLK input via the switch SW2 are measured, and measurement results are output to the control logic circuit 42. The switches SW1 and SW2 are controlled to be turned on or off by the control circuit 32. The switches SW1 and SW2 may be configured with transistors.

Figure 9:
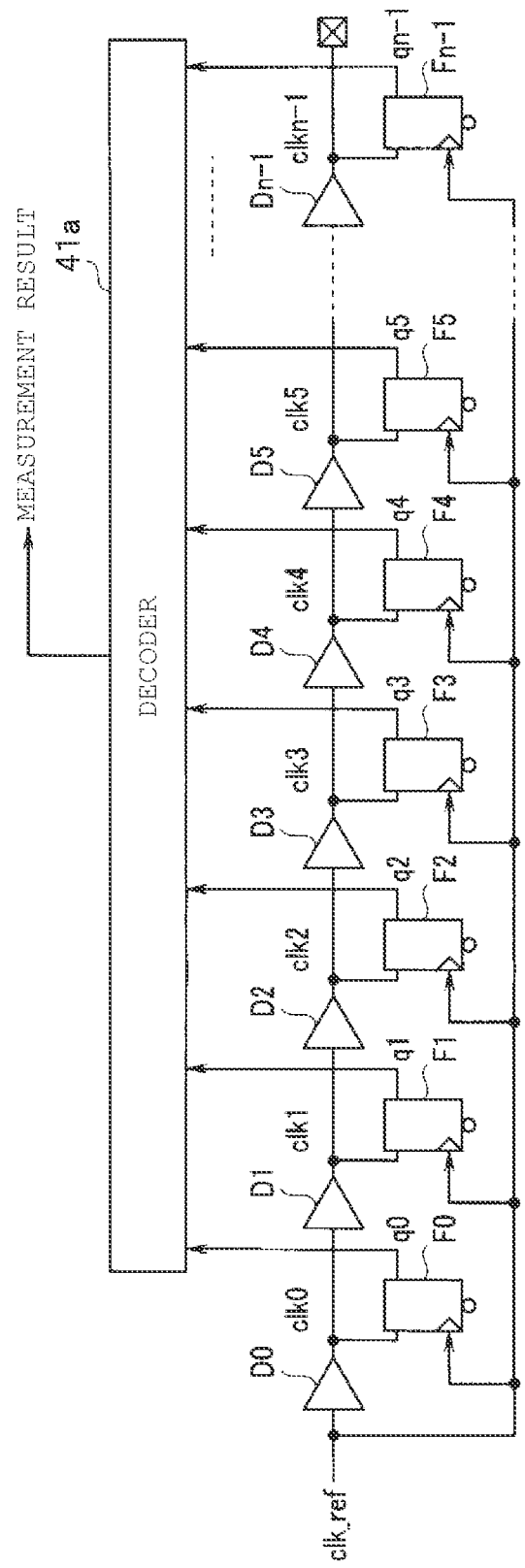
FIG. 9 is a circuit diagram illustrating an example of a specific configuration of a frequency measurement circuit in FIG. 8.
Figure 10:
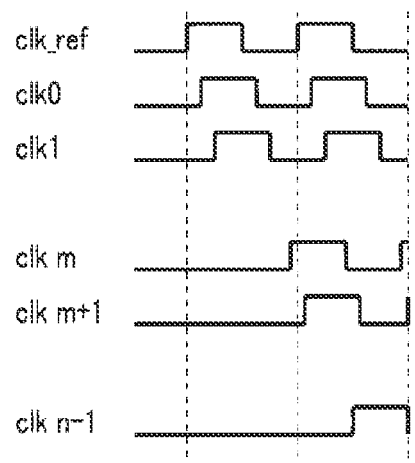
FIG. 10 is a timing chart illustrating an operation of the circuit illustrated in FIG. 9.

FIG. 9 is a circuit diagram illustrating an example of a specific configuration of the frequency measurement circuit 41 in FIG. 8. In FIG. 9, the frequency measurement circuit 41 is configured with a time-to-digital converter (TDC) circuit. FIG. 10 is a timing chart illustrating an operation of the circuit illustrated in FIG. 9.

The frequency measurement circuit 41 includes a plurality of delay elements D0 to Dn−1 (hereinafter representatively referred to as delay elements D when the delay elements are not distinguished from each other) which are cascade-connected, and phase detectors F0 to Fn−1 (hereinafter representatively referred to as phase detectors F when the phase detectors are not distinguished from each other) to which outputs clk0 to clkn−1 of the delay elements D0 to Dn−1 are respectively given. A clock clk_ref is input to the delay element D0 at the first stage. The clock clk_ref passes through the delay elements D in sequence while being delayed by the delay elements D0 to Dn−1. FIG. 10 illustrates the clock clk_ref and the outputs clk0 to clkn−1 of the delay elements D0 to Dn−1.

The outputs clk0 to clkn−1 are respectively given to the phase detectors F0 to Fn−1. The phase detectors F0 to Fn−1 take the outputs clk0 to clkn−1 at a rising timing of the second clock clk_ref. In the example of FIG. 10, at the rising timing of the second clock clk_ref, outputs of the delay elements D through which the first clock clk_ref has not passed are at a low level (hereinafter referred to as an L level) and outputs of the phase detectors F to which the outputs of these delay elements D are given are also at the L level. At the rising timing of the second clock clk_ref, an output of the delay element D at the most rear stage among the delay elements D through the first clock clk_ref has passed is at a high level (hereinafter referred to as an H level). An output of the phase detector F to which an output of the delay element D is given is also at the H level.

In the example of FIG. 10, the clock clk_ref has passed through the delay elements D until an m-th stage and has not passed through the delay element D at an m+1-th stage. That is, one period of the clock clk_ref is equivalent to a delay time of the delay element D at the m+1-th stage. Outputs q0 to qn−1 of the phase detectors F0 to Fn−1 are given to decoders 41*a*. The decoders 41*a* obtain a period of the clock clk_ref from the outputs q0 to qn−1 of the phase detectors F0 to Fn−1. The decoders 41*a* output the obtained period as a measurement result to the control logic circuit 42.

The control logic circuit 42 is controlled by the control circuit 32 such that a frequency difference or a period difference between the clock CLK and the reference clock RECLK is obtained based on the measurement result from the frequency measurement circuit 41, and a logic operation of obtaining the setting information to be set in at least one of the VIC circuit and the OSC 12 is performed according to the obtained frequency difference or period difference. That is, the control logic circuit 42 obtains setting information for matching the frequency of the clock CLK from the OSC 12 with the frequency of the reference clock RECLK. The control logic circuit 42 outputs the obtained setting information to the control circuit 32. The control circuit 32 changes the setting of at least one of the VIC circuit 11 and the OSC 12 based on the setting information obtained by the control logic circuit 42.

The other configurations are similar to those of the first embodiment.

Figure 11:
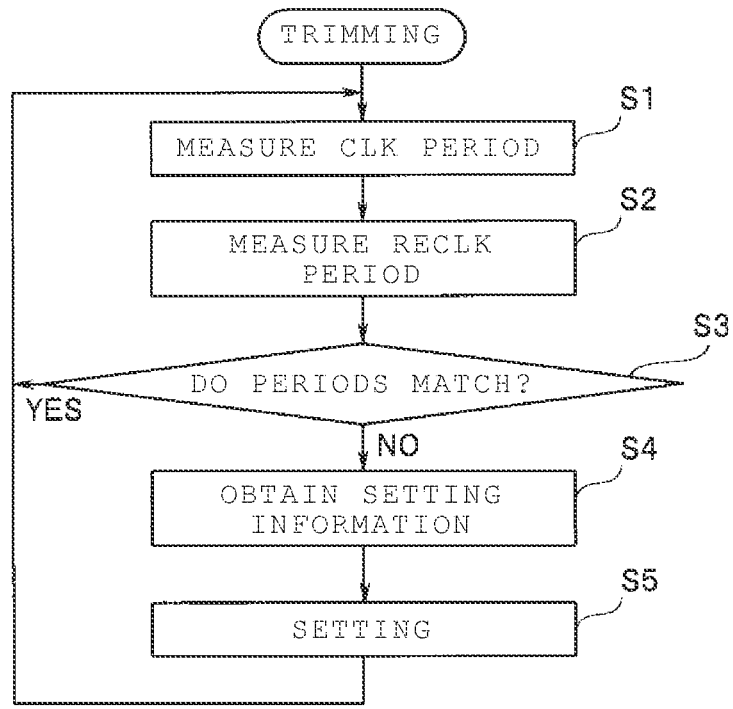
FIG. 11 is a flowchart illustrating an operation of a circuit illustrated in FIG. 8.
Figure 12:
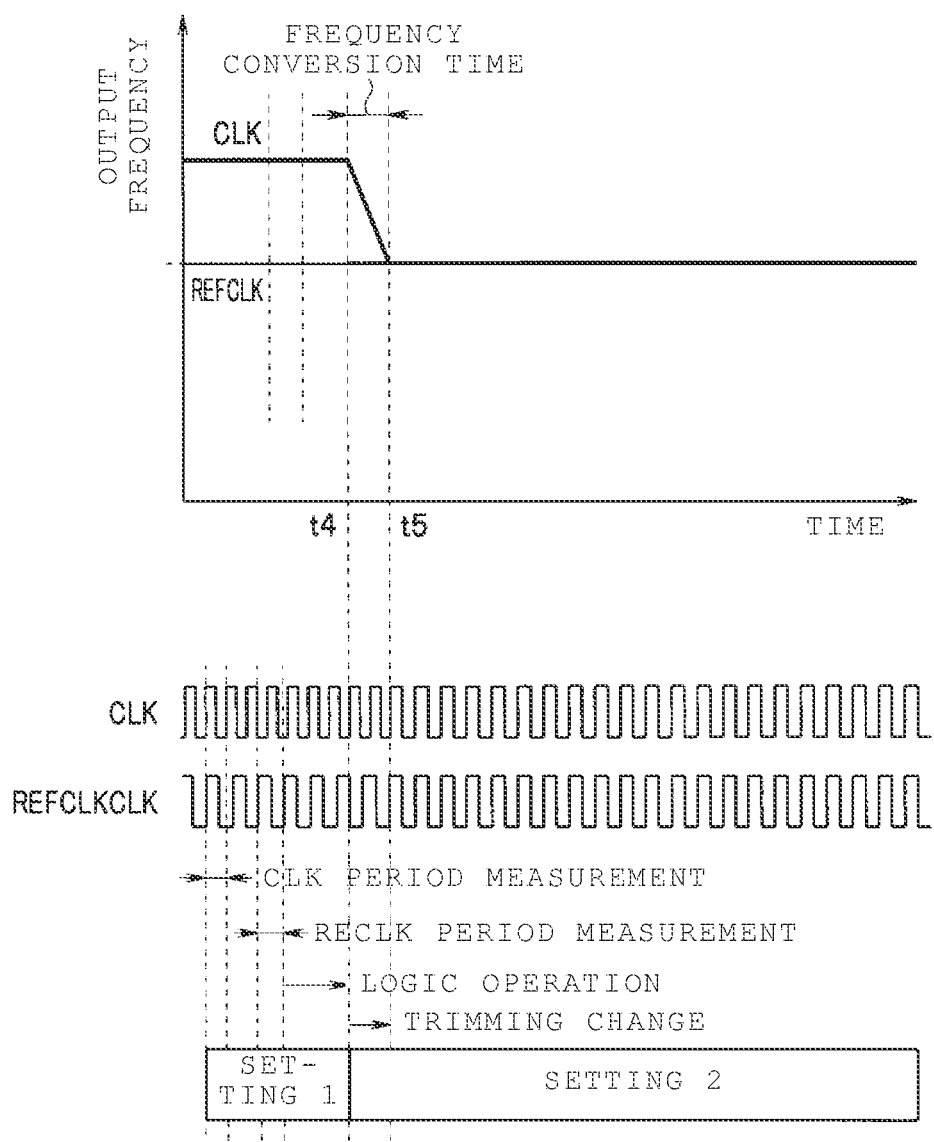
FIG. 12 is a diagram illustrating the operation of the circuit illustrated in FIG. 8.

Next, an operation of the embodiment configured as such will be described with reference to the flowchart of FIG. 11 and the diagram of FIG. 12. The upper part of FIG. 12 illustrates a graph indicating a change in the frequency of the clock CLK when the horizontal axis represents a time and the vertical axis represents an output frequency. The lower part of FIG. 12 illustrates the clock CLK and the reference clock RECLK and illustrates a processing time of the frequency measurement circuit 41 and the control logic circuit 42 when the horizontal axis is a time axis as in the upper part and the vertical axis represents a level. In the following description, the frequency measurement circuit 41 measures a period for description, may measure a frequency.

After power is supplied, the clock CLK is input to the frequency measurement circuit 41 via the switch SW1 and the reference clock RECLK is input via the switch SW2. The frequency measurement circuit 41 measures a period of the clock CLK (hereinafter referred to as a CLK period) (S1), subsequently measures a period of the reference clock RECLK (hereinafter referred to an RECLK period), and outputs the measurement results to the control logic circuit 42. The control logic circuit 42 determines whether the periods match one another, that is, the frequencies of the clock CLK and the reference clock RECLK match one another. When the frequencies do not match one another, setting information for matching the frequency of the clock CLK with the frequency of the reference clock RECLK is obtained and output to the control circuit 32 (S4). The control circuit 32 sets at least one of the VIC circuit 11 and the OSC 12 based on the setting information (S5).

FIG. 12 illustrates a change in the frequency of the clock CLK after the clock CLK with the stable frequency is output from the OSC 12 of the clock generation circuit 10 after the supply of power. After the clock CLK is stabilized, it is assumed that the CLK period matches the RECLK period at a start timing of the time axis of FIG. 12. Immediately after the start timing of the time axis of FIG. 12, the frequency of the reference clock RECLK is assumed to be lower than a previous frequency.

As illustrated in FIG. 12, at a predetermined 1 CLK period of the clock CLK, the switch SW1 is turned on, the clock CLK is supplied to the frequency measurement circuit 41, and the period (CLK period) is measured by the frequency measurement circuit 41. At 1 RECLK period after, for example, a 1.5 CLK period from the frequency measurement period of the clock CLK, the switch SW2 is turned on, the clock RECLK is supplied to the frequency measurement circuit 41, and the period (RECLK period) is measured by the frequency measurement circuit 41.

At, for example, a 2.5 RECLK period from the final of the frequency measurement period of the reference clock RECLK, a logic operation is performed by the control logic circuit 42 and setting information which is an operation result is supplied to the control circuit 32. The control circuit 32 changes the setting value of at least one of the VIC circuit 11 and the OSC 12 based on the setting information at, for example, a 1.5 RECLK period from a timing t4 after end of the logic operation period of the setting information. The setting change ends at a timing t5 after the 1.5 RECLK period from a timing t4. That is, in the example of FIG. 12, a period necessary from the timing t4 at which the change in the frequency starts to the timing t5 at which the period is changed to a desired frequency is, for example, the 1.5 RECLK period. When the frequency of the clock CLK cannot match the frequency of the reference clock RECLK through the setting change performed once, the processes of S1 to S5 are repeated to match the frequency of the clock CLK with the frequency of the clock RECLK. When the frequencies of the clock CLK and the reference clock RECLK are relatively close to each other, it is conceivable that the frequencies can be matched through the setting change performed once.

For example, by supplying the clock generated by the clock generation circuit 22 in FIG. 2 as the reference clock RECLK to the frequency measurement circuit 41, it is possible to generate a clock with the same frequency as the frequency FX of the output clock of the clock generation circuit 22 from the OSC 12. Then, the change in the frequency FX is followed to change the frequency of the output clock of the OSC 12 in a relatively short time. In the example of FIG. 12, a 9 CLK period is necessary from the measurement to the change in the frequency. However, when the change in FX is known in advance, it is possible to change FY after a considerably short time indicating a frequency change time of FIG. 12 from the change in FX by generating the reference clock RECLK corresponding to the changed FX before the change in FX.

As such, in the embodiment, it is possible to match the frequency of the clock generated by the OSC 12 with the frequency of the reference clock, and it is possible to follow the change in the frequency of the reference clock to change the frequency in a short time.

As described above in the example, the frequency measurement circuit 41 measures the clock period at one period of the clock. However, the clock period may also be measured at a half-period. Here, the frequency accuracy deteriorates, but it is possible to change the frequency of the output clock in a shorter time. For example, by first performing clock period measurement at a half-period and performing clock period measurement halfway at one period, it is possible to achieve frequency accuracy and acceleration with a good balance.

(Modifications)

Figure 13:
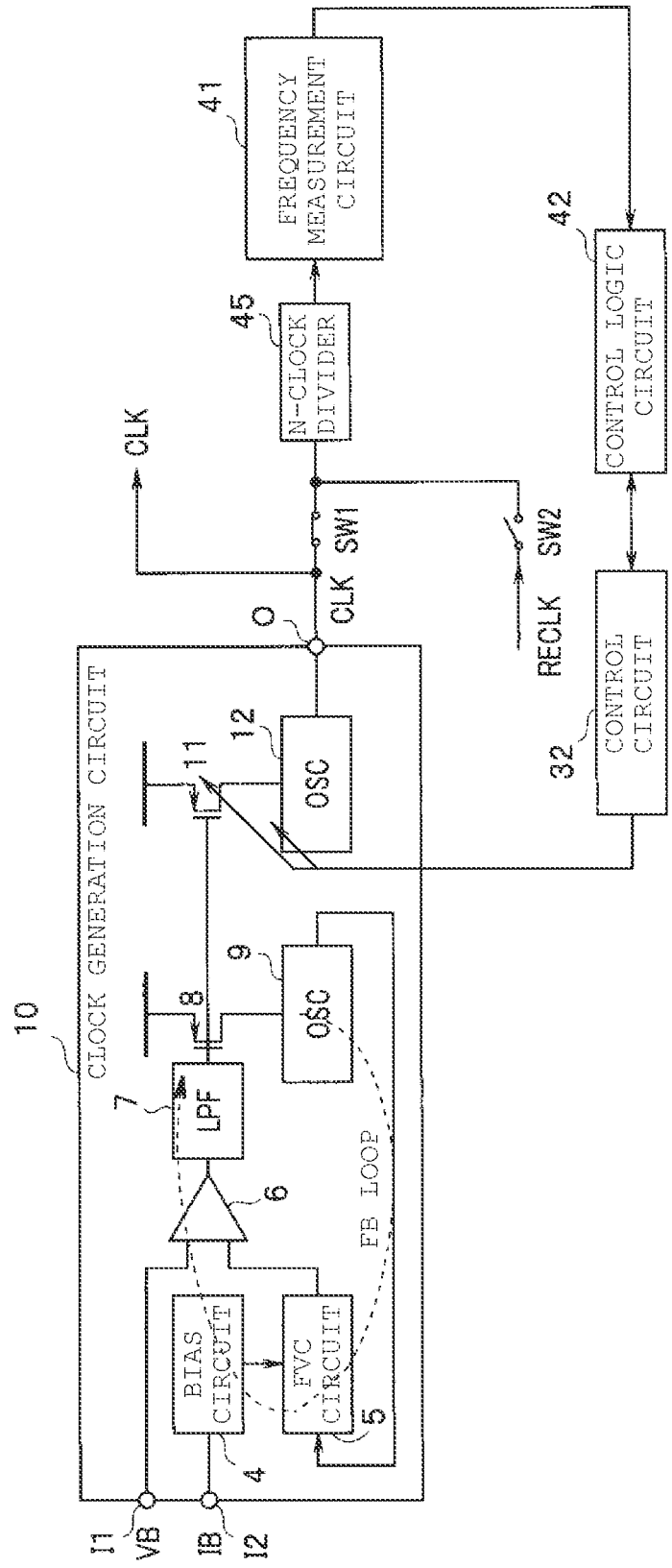
FIG. 13 is a block diagram according to a modified example.
Figure 14:
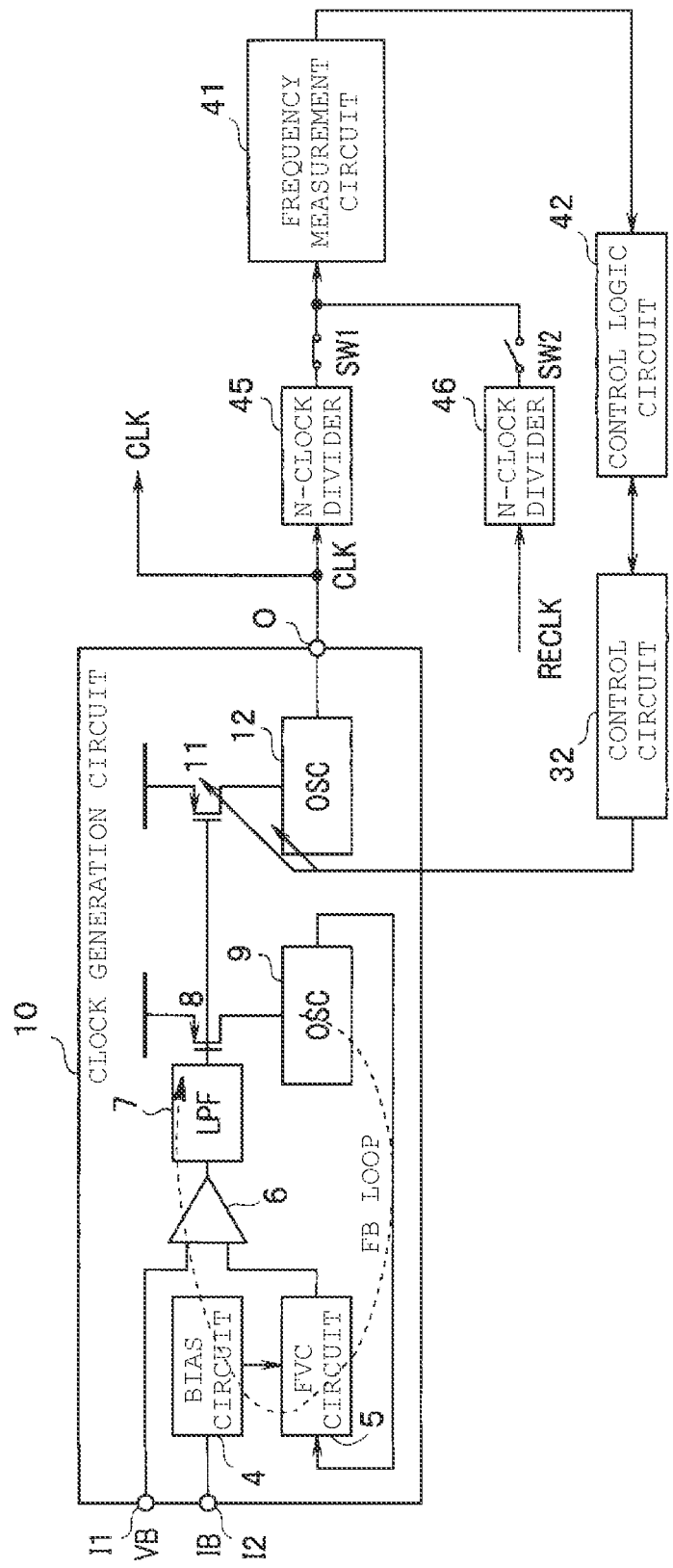
FIG. 14 is a block diagram according to another modified example.

FIGS. 13 and 14 are block diagrams illustrating modifications. In FIGS. 13 and 14, the same reference numerals are given to the same elements as those of FIG. 8 and description thereof will be omitted.

A modification of FIG. 13 is different from the embodiment of FIG. 8 in that a N-clock divider 45 is added. The N-clock divider 45 divides the clock CLK input via the switch SW1 and the reference clock RECLK input via the switch SW2 into N clocks and give the divided clocks to the frequency measurement circuit 41.

In such a configuration, the frequency measurement circuit 41 may measure periods for the N-divided clocks CLK and the reference clock RECLK. Accordingly, it is possible to improve frequency measurement accuracy of the frequency measurement circuit 41 compared to direct measurement of the periods of the clock CLK and the reference clock RECLK.

Here, a measurement time of a period in the frequency measurement circuit 41 becomes long by a division number N multiplication. Therefore, the division number may be set to be suitable for a system to which the embodiment is applied, and a measurement time and frequency measurement accuracy may be determined.

A modification of FIG. 14 is different from the embodiment of FIG. 8 in that N-clock dividers 45 and 46 are added. The N-clock divider 45 divides the clock CLK into N clocks and gives the divided clocks to the frequency measurement circuit 41 via the switch SW1. The N-clock divider 46 divides the reference clock RECLK into N clocks and gives the divided clocks to the frequency measurement circuit 41 via the switch SW2.

The modification of FIG. 14 is different from the modification example of FIG. 13 in that the division number with respect to the clock CLK and the division number with respect to the reference clock RECLK can be individually set. Other operational effects are similar to those of FIG. 13.

Third Embodiment

FIGS. 15 to 20 illustrate a third embodiment. In the embodiment, specific circuits adopted as the VIC circuit 11 and the OSC 12 will be described.

Example 1 of OSC

Figure 15:
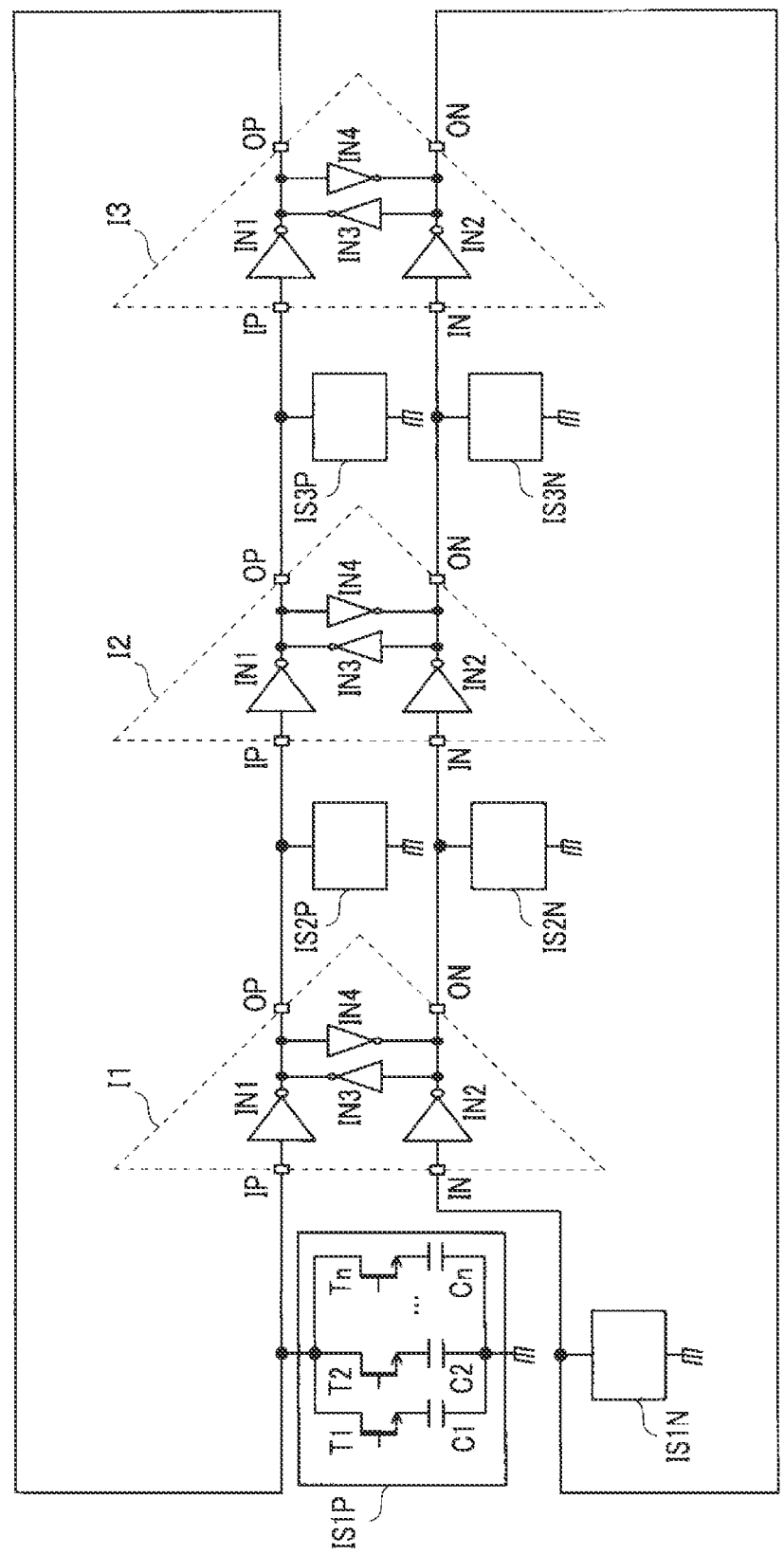
FIG. 15 is a circuit diagram illustrating an example of an OSC which may be adopted in each embodiment.

FIG. 15 is a diagram illustrating an example of a specific configuration of the OSC which may be adopted in each of the foregoing embodiments.

FIG. 15 illustrates a ring oscillator configured with inverters I1, I2, and I3 (hereinafter referred to inverters I when the inverters are not distinguished from each other) at three stages. The inverter I has a differential configuration and includes a non-inverted input end IP, an inverted input end IN, a non-inverted output end OP, and an inverted output end ON. The inverter I includes inverters IN1, IN2, IN3, and IN4. The inverter IN1 inverts a signal input to the non-inverted input end IP and outputs the inverted signal to the non-inverted output end OP. The inverter IN2 inverts a signal input to the inverted end IN and outputs the inverted signal to the inverted output end ON. When an average is taken for a relatively long time, ⅓ of a current from the VIC circuit 11 is supplied to each of the inverters I1 to I3.

The inverter IN4 inverts an output of the inverter IN1, gives the inverted output to the output end of the inverter IN2. The inverter IN3 inverts the output of the inverter IN2 and gives the inverted output to the output end of the inverter IN1. In a latch circuit by the inverters IN3 and IN4, the inverter I performs a differential operation. A mutually inverted input signal is input to each of the non-inverted input end IP and the inverted input end IN, and each inverter I inverts the input signal and outputs the inverted input signal from the non-inverted output end OP and the inverted output end ON.

The signals output from the out ends OP and ON of the inverter I1 are given to the input ends IP and IN of the inverter I2, are inverted by the inverter I2, and are output from the output ends OP and ON of the inverter I2. The signals output from the output ends OP and ON of the inverter I2 are given to the input ends IP and IN of the inverter I3, are inverted by the inverter I3, and are output from the output ends OP and ON of the inverter I3. The signals output from the output ends OP and ON of the inverter I3 are given to the input ends IP and IN of the inverter I1, inverted by the inverter I1, and are output from the output ends OP and ON of the inverter I1.

In the embodiment, trimming circuit IS1P, IS2P, and IS3P (hereinafter referred to as trimming circuits ISP when the trimming circuits are not distinguished from each other) that each adjust a frequency of oscillation are respectively connected to the non-inverted input ends IP of the inverters I1, I2, and I3. Trimming circuit IS1N, IS2N, and IS3N (hereinafter referred to as trimming circuits ISN when the trimming circuits are not distinguished from each other) that each adjust a frequency of oscillation are respectively connected to the inverted input ends IN of the inverters I1, I2, and I3. The trimming circuits IS1P, IS2P, IS3P, IS1N, IS2N, and IS3N have the same configuration.

The trimming circuit ISP includes a plurality of switches T1, T2, . . . , and Tn and a plurality of capacitors C1, C2, . . . , and Cn. The switches T1, T2, . . . , and Tn may be configured with transistors. The switch T1 and the capacitor C1 are connected in series between the non-inverted input end IP and a reference potential point. Similarly, the switch Tm (where m is 1 to n) and the capacitor Cm are connected in series between the non-inverted input end IP and the reference potential point.

The trimming circuit ISN includes a plurality of switches T1, T2, . . . , and Tn and a plurality of capacitors C1, C2, . . . , and Cn. The switches T1, T2, . . . , and Tn may be configured with transistors. The switch T1 and the capacitor C1 are connected in series between the inverted input end IN and the reference potential point. Similarly, the switch Tm (where m is 1 to n) and the capacitor Cm are connected in series between the inverted input end IN and the reference potential point.

The switches T1, T2, and Tn are controlled to be turned on or off by the control circuit 32. The control circuit controls the switches T1, T2, and Tn such that the switches are turned on or off based on the setting information stored in the memory 36 or the setting information from the control logic circuit 42. The switches T1, T2, . . . , and Tn are turned on, and thus a capacitor connected to a switch which is turned on among the capacitors C1, C2, . . . , and Cn is connected between the non-inverted input end IP or the inverted input end IN and the reference potential point. Hereinafter, when the switches T1, T2, . . . , and Tn are turned on, capacitance obtained by one capacitor or a plurality of capacitors connected between the non-inverted input end IP or the inverted end IN and the reference potential point among the capacitors C1, C2, . . . , and Cn is assumed to be capacitance between the non-inverted input end IP and the inverted input end IN, and the reference potential point.

In the OSC with such a configuration, oscillation is performed at a frequency of oscillation based on a delay time of the inverters I and the number of stages of the inverters I. The frequency of oscillation is adjusted with the capacitance between the non-inverted input end IP and the inverted input end IN, and the reference potential point. The control circuit 32 simultaneously turns on or off all of the switches Tm (where m is 1 to n) of the trimming circuits ISP and ISN. For example, the frequency of oscillation is adjusted by adjusting the number of switches which are turned on among the switches T1, T2, . . . , and Tn.

In the OSC of FIG. 15, as a current supplied from the VIC circuit 11 is larger, a time necessary for charging of the capacitance between the non-inverted input end IP and the inverted input end IN, and the reference potential point is shorter and a clock frequency of oscillation is higher. Conversely, as the current supplied from the VIC circuit 11 is smaller, the time necessary for charging of the capacitance between the non-inverted input end IP and the inverted input end IN, and the reference potential point is longer and the clock frequency of oscillation is lower. As the capacitance between the non-inverted input end IP and the inverted input end IN, and the reference potential point is smaller, the time necessary for charging is shorter and the clock frequency of oscillation is higher. As the capacitance between the non-inverted input end IP and the inverted input end IN, and the reference potential point is larger, the time necessary for charging is longer and the clock frequency of oscillation is lower.

As such, in the OSC of FIG. 15, the control circuit 32 controls the switches T1, T2, . . . , and Tn of the trimming circuits ISP and ISN based on the setting information such that the switches are turned on or off, and thus it is possible to change the clock frequency of oscillation. Thus, it is possible to change the frequency in a short time without giving disturbance to the FB loop.

In the example of FIG. 15, the configuration of the inverters at three stages is illustrated, but a configuration with any number of stages may be used. By switching capacitance of each terminal, it is possible to change the clock frequency of oscillation in a short time.

Example 2 of OSC

Figure 16:
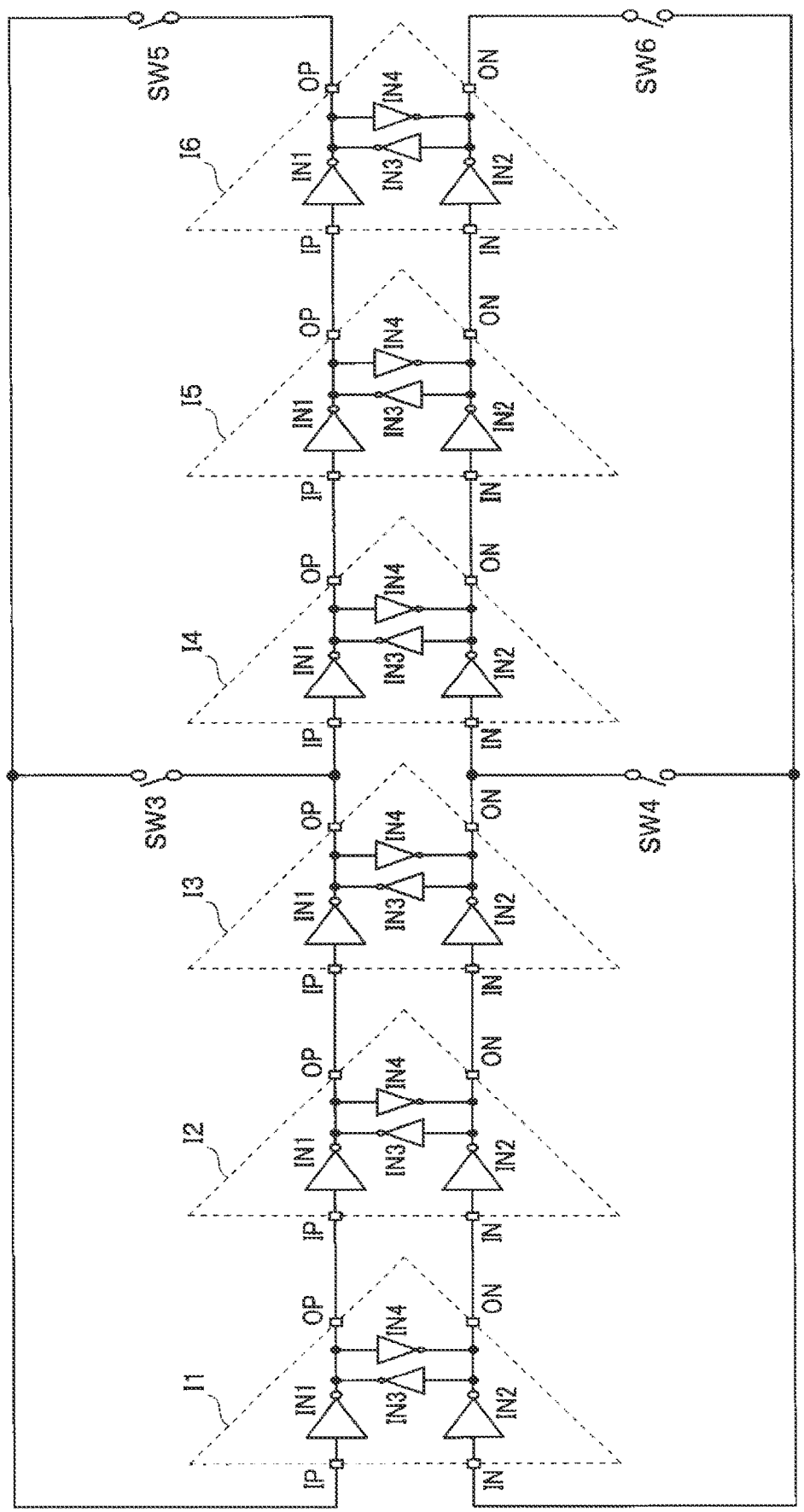
FIG. 16 is a circuit diagram illustrating another example of the OSC which may be adopted in each embodiment.

FIG. 16 is a circuit diagram illustrating another OSC which may be adopted in each of the foregoing embodiments. In FIG. 16, the same reference numerals are given to the same elements as those of FIG. 15 and description thereof will be omitted. In the modification, by changing the number of stages of the inverters included in the ring oscillator, it is possible to change the clock frequency of oscillation.

A configuration of the inverters I1, I2, and I3 in FIG. 16 is similar to the configuration of the inverters I1, I2, and I3 in FIG. 15. A configuration of the inverters I4, I5, and I6 in FIG. 16 is also similar to the configuration of the inverters I1, I2, and I3 in FIG. 15. The inverters I4, I5, and I6 are cascade-connected to the inverters I1, I2, and I3.

In the modification, the non-inverted output end OP of the inverter I3 is connected to the non-inverted input end IP of the inverter I1 via the switch SW3. The inverted output end ON of the inverter I3 is connected to the inverted input end IN of the inverter I1 via the switch SW4. The non-inverted output end OP of the inverter I6 is connected to the non-inverted input end IP of the inverter I1 via the switch SW5. The inverted output end ON of the inverter I6 is connected to the inverted input end IN of the inverter I1 via the switch SW6.

The switches SW3 to SW6 are controlled to be turned on or off by the control circuit 32. Based on the setting information, the control circuit 32 simultaneously turns on the switches SW3 and SW4 and simultaneously turns off the switches SW5 and SW6, or simultaneously turns off the switches SW3 and SW4 and simultaneously turns on the switches SW5 and SW6.

The control circuit 32 simultaneously turns on the switches SW3 and SW4 and simultaneously turns off the switches SW5 and SW6, and the OSC in FIG. 16 has a configuration of three stages of the inverters I1, I2, and I3. The control circuit 32 simultaneously turns off the switches SW3 and SW4 and simultaneously turns on the switches SW5 and SW6, and the OSC in FIG. 16 has a configuration of six stages of the inverters I1, I2, I3, I4, I5, and I6.

In the OSC with such a configuration, the frequency of oscillation is changed depending on whether the number of stages of the inverters I is three stages or six stages. The control circuit 32 simultaneously turns on the switches SW3 and SW4 and simultaneously turns off the switches SW5 and SW6, and an oscillator is configured with three stages. From this state, the control circuit 32 simultaneously turns off the switches SW3 and SW4 and simultaneously turns on the switches SW5 and SW6, the OSC in FIG. 16 is changed to an oscillator with a configuration of six stages, and thus the clock frequency of oscillation is lowered.

As such, based on the setting information, the OSC of FIG. 16 can change the clock frequency of oscillation when the control circuit 32 controls the switches SW3 to SW6 such that the switches are turned on or off. Thus, the frequency can be changed in a short time without giving disturbance to the FB loop.

The example of FIG. 16 is an example in which the number of stages is changed at two stages. However, by increasing the number of stages, the number of stages can be changed at any stage.

(VIC Circuit)

Figure 17:
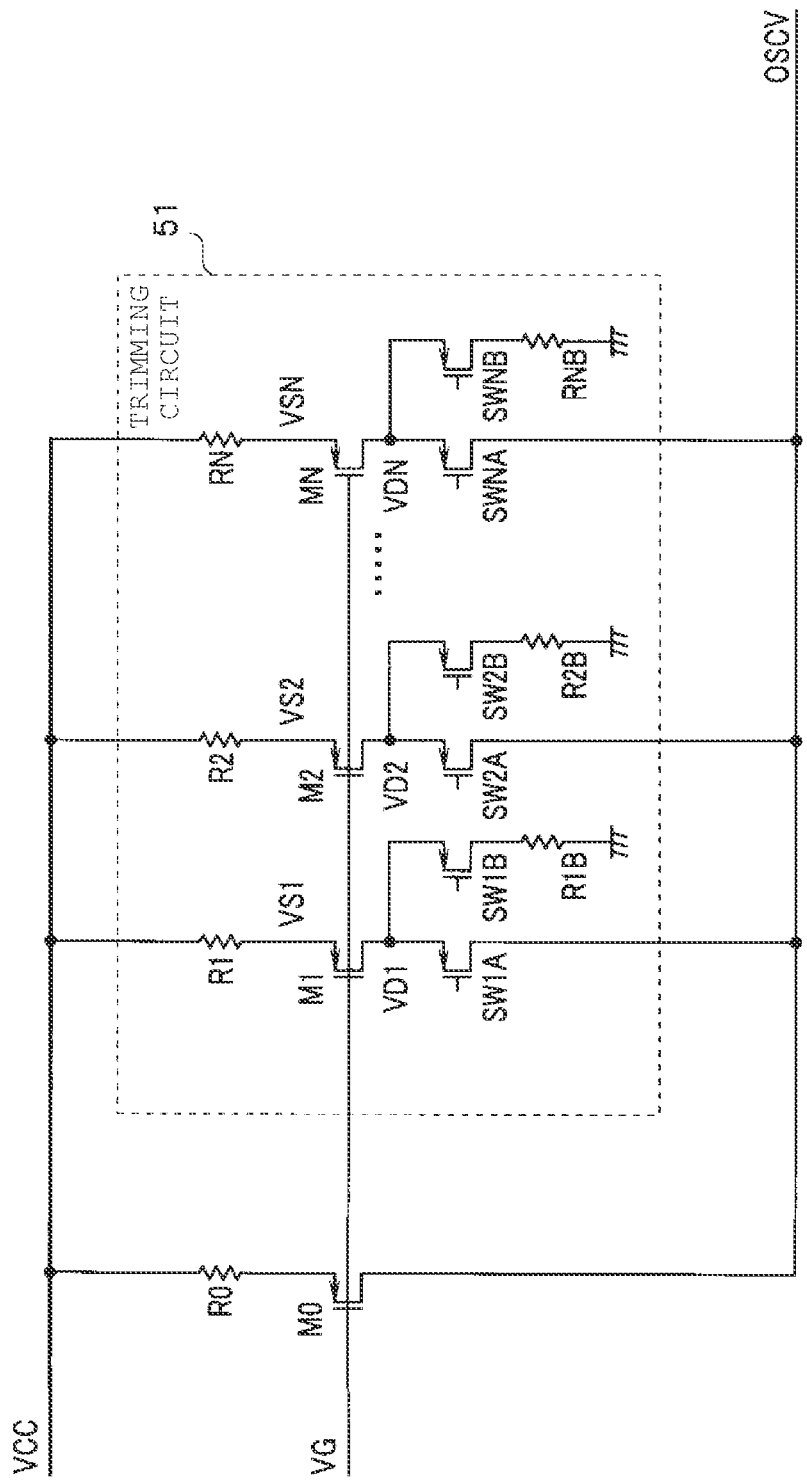
FIG. 17 is a circuit diagram illustrating a specific example of a VIC circuit which may be adopted in each embodiment.

FIG. 17 is a circuit diagram illustrating a specific example of the VIC circuit 11 adopted to each of the foregoing embodiments.

A resistor R0 and a current path of a PMOS transistor M0 are connected in series between a current supply line OSCV and a power line supplying the voltage VCC. In the transistor M0, a source is connected to the power line via the resistor R0, a drain is connected to the current supply line OSCV, a voltage VG is supplied from the LPF 7 to the gate. The transistor M0 generates a drain current according to the voltage VG and supplies the generated current to the OSC 12 via the current supply line OSCV.

In the embodiment, the resistor R1, a current path of the PMOS transistor M1, and a PMOS transistor SW1A are connected in series between the power line supplying the voltage VCC and the current supply line OSCV. A plurality of configurations similar to the configuration of the resistor R1 and the transistors M1 and SW1A are provided. In general, a resistor Rm (where m is 1 to N), a current path of the PMOS transistor Mm, and the PMOS transistor SWmA are connected in series between the power line supplying the voltage VCC and the current supply line OSCV. In the transistor Mm, a source is connected to the power line via the resistor Rm, a drain is connected to the source of the transistor SWmA, and the voltage VG is supplied to a gate. In the transistor SWmA, a drain is connected to the current supply line OSCV and a control signal from the control circuit 32 is supplied to a gate.

A current path of the transistor SWmB and a resistor RmB are connected in series between the source of the transistor SWmA and the reference potential point. In the transistor SWmB, a source is connected to the source of the transistor SWmA, a drain is connected to the reference potential point via the resistor RmB, and a control signal from the control circuit 32 is supplied to a gate. Based on the setting information, the control circuit 32 generates the control signal and controls the transistors SW1A to SWNA and SW1B to SWNB such that the transistors are turned on or off.

Resistors R1 to RN and R1B to RNB and the transistors M1 to MN, SW1A to SWNA, and SW1B to SWNB form a trimming circuit 51. The transistors M1 to MN generate a drain current according to the voltage VG. The drain current generated by the transistors M1 to MN is supplied to the OSC 12 via the current supply line OSCV via the respective transistors SW1A to SWNA. Accordingly, the control circuit 32 controls the transistors SW1A to SWNA such that the transistors are turned on or off, a current supply amount to the OSC 12 is changed, and thus the clock frequency of oscillation of the OSC 12 can be changed.

Incidentally, when a current supplied to the OSC 12 via the current supply line OSCV is changed, it is necessary to configure a circuit that does not change the voltage VG. This is because when the voltage VG is changed, disturbance is given to the FB loop, and thus a long time is necessary until the frequency is stabilized. Accordingly, in the embodiment, the control circuit 32 complementarily turns on or off the transistors SWmA and SWmB. That is, when one of the transistors SWmA and SWmB is turned on, the other transistor is turned off. Thus, a drain current generated in the transistors M1 to MN flows to the current supply line OSCV side via the transistor SWmA or flows to the reference potential point via the transistor SWmB.

That is, when a current supply destination of the drain current generated in the transistors M1 to MN is changed, the transistors M1 to MN constantly flow the drain current. The current flowing in the transistors M1 to MN does not change. Therefore, since the voltage applied to the resistors R1 to RN and a voltage Vgs between the gate and the source of the transistors M1 to MN does not change, the voltage VG is not changed and disturbance is not given to the FB loop.

As such, in the embodiment, it is possible to change the current supply amount to the OSC 12 without giving disturbance to the FB loop and it is possible to change the output frequency of the OSC 12 in a short time.

For the resistors R1B to RNB, resistant elements are used, but these resistors may be implemented without resistors.

(Multiplication)

Figure 18:
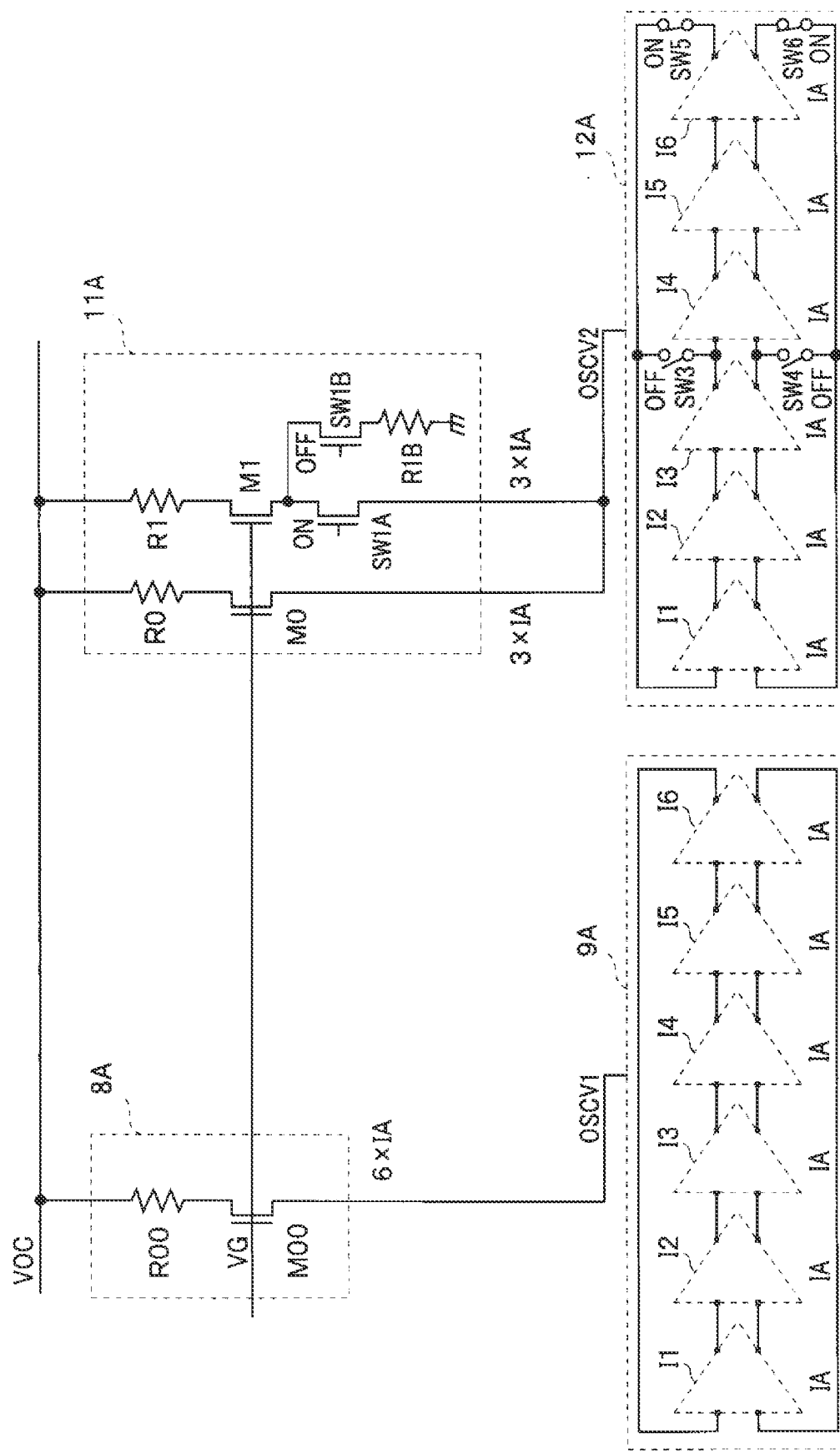
FIG. 18 is a circuit diagram illustrating an example of a case where a frequency is multiplied when the OSC in FIG. 16 and the VIC circuit in FIG. 17 are adopted.
Figure 19:
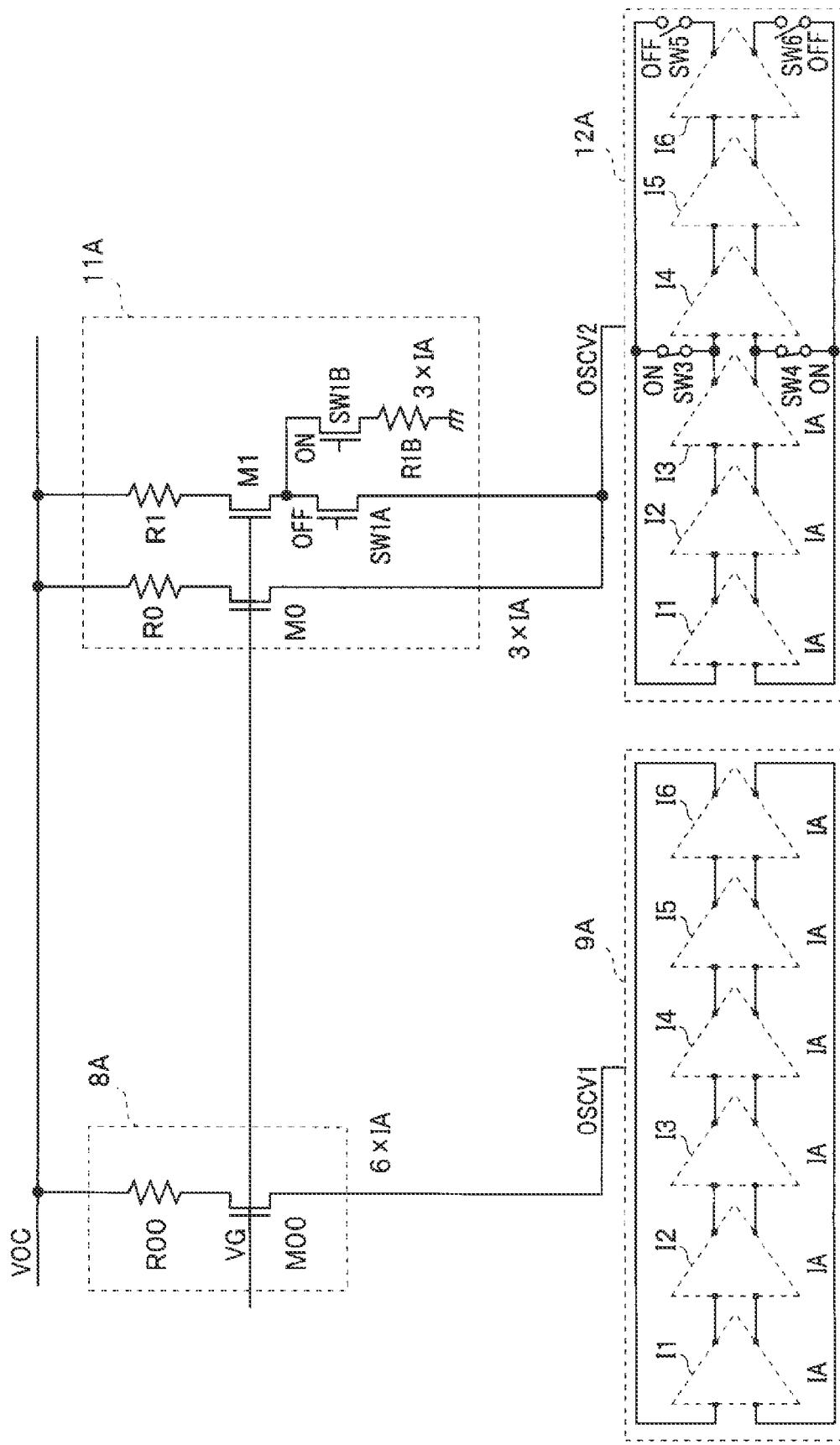
FIG. 19 is a circuit diagram illustrating another example of a case where a frequency is multiplied when the OSC in FIG. 16 and the VIC circuit in FIG. 17 are adopted.

FIGS. 18 and 19 are circuit diagrams illustrating an example of a case where the frequency is multiplicate when the OSC of FIG. 16 and the VIC circuit of FIG. 17 are adopted.

An example of FIGS. 18 and 19 is an example in which a VIC circuit 8A, an OSC 9A, a VIC circuit 11A, and an OSC 12A are respectively adopted as the VIC circuit 8, the OSC 9, the VIC circuit 11, and the OSC 12 in FIG. 1. The VIC circuit 8A includes a resistor R00 and a current path of a PMOS transistor M00 connected in series between a power line supplying the voltage VCC and a current supply line OSCV1. In the transistor M00, a source is connected to a power line via the resistor R00, a drain is connected to the OSC 9A via the current supply line OSCV1, and the voltage VG from the LPF 7 is supplied to a gate. The transistor M00 generates a drain current according to the voltage VG and supplies the generated drain current to the OSC 9A via the current supply line OSCV1.

In the VIC circuit 11A, the resistors R1 and R1B and the transistors M1, SW1A, and SW1B of one system in the trimming circuit 51 of FIG. 17 are adopted.

The OSC 9A is configured with the inverters I1 to I6 which are cascade-connected. The configuration of the inverters I1 to I6 is similar to the inverters I1 to I6 of FIG. 16. In the OSC 9A, the switches SW3 to SW6 are omitted from the configuration of FIG. 16, the non-inverted output end OP of the inverter I6 is connected to the non-inverted input end IP of the inverter I1, and the inverted output end ON of the inverter I6 is connected to the inverted input end IN of the inverter I1.

The configuration of the OSC 12A is the same as that of FIG. 16.

As illustrated in FIG. 18, the control circuit 32 performs setting so that the transistor SW1A is turned on and the transistor SW1B is turned off in the VIC circuit 11A, and SW3 and SW4 are turned off, and SW5 and SW6 are turned on, in the OSC 12A.

Here, a drain current of the transistor M00 of the VIC circuit 8A is assumed to be 6×IA. The drain current is supplied to the inverters I1 to I6 of the OSC 9A via the current supply line OSCV1. Thus, a current amount IA is supplied to the inverters I1 to I6 of the OSC 9 when an average for a relatively long time is taken.

On the other hand, a drain current amount of the transistor M0 of the VIC circuit 11A is assumed to be 3×IA and a drain current amount of the transistor M1 is assumed to be 3×IA. Here, since the transistor SW1A is turned on, a current amount supplied from the VIC circuit 11A to the current supply line OSCV2 is 6×IA. Thus, the current amount IA is supplied to the inverters I1 to I6 of the OSC 12 when an average for a relatively long time is taken.

When characteristics the OSC 9A and the OSC 12A are the same, the frequency of oscillation of the OSC 9A is the same as the frequency of oscillation of the OSC 12A.

As illustrated in FIG. 19, the control circuit 32 performs setting so that the transistor SW1A of the VIC circuit 11A is turned off, the transistor SW1B is turned on, SW3 and SW4 of the OSC 12A are turned on, and SW5 and SW6 are turned off.

Even when the control circuit 32 performs the setting change of the VIC circuit 11A and the OSC 12A, there is no influence on the FB loop. Therefore, the voltage VG is not changed and a current amount supplied to the inverters I1 to I6 of the OSC 9A remains to be IA and the frequency of oscillation of the OSC 9A is not changed either. Conversely, since the transistor SW1A is turned off and the transistor SW1B is turned on, the drain current of the transistor M1 flows to the reference potential point. Accordingly, the current amount supplied from the VIC circuit 11A to the OSC 12A via the current supply line OSCV2 is 3×IA which is ½ of the case of FIG. 18.

The OSC 12A has a configuration of three stages since the switches SW5 and SW6 are turned off and the switches SW3 and SW4 are turned on. Accordingly, the current amount IA is supplied to the inverters I1 to I3 of the OSC 12A when an average for a relatively long time is taken, like the case of FIG. 18. Accordingly, since a delay amount of each of the inverters I1 to I3 of the OSC 12A is the same as that of FIG. 18 and the number of stages is halved, the frequency of oscillation of the OSC 12A is twice the frequency of oscillation in the state of FIG. 18.

As such, in the examples of FIGS. 18 and 19, the frequency of oscillation can be multiplicated under the control performed once by the control circuit 32. In the examples of FIGS. 18 and 19, for example, the frequency is multiplicated twice. However, when the early number of stages in the OSC 12 is X, the number of stages after the setting change is Y, and a current generated in the VIC circuit 11A is a X/Y multiple, the frequency of oscillation may be changed by a free magnification of the X/Y multiple.

Incidentally, in the systems of FIGS. 2 and 3, transmission of data is started from the system X or the memory controller 21 after FY is stabilized. Accordingly, to reduce power consumption until the transmission of the data is started from the system X or the memory controller 21, an initial value of FY may be set to a relatively low frequency. However, here, a difference between FY and FX is relatively large in some cases, and thus it is conceivable that a relatively long time is necessary in the trimming process illustrated in FIG. 11. Here, as illustrated in FIGS. 18 and 19, when the frequency can be set to the X/Y multiple under the control performed once, the frequency may be changed to a desired frequency in a relatively short time.

Figure 20:
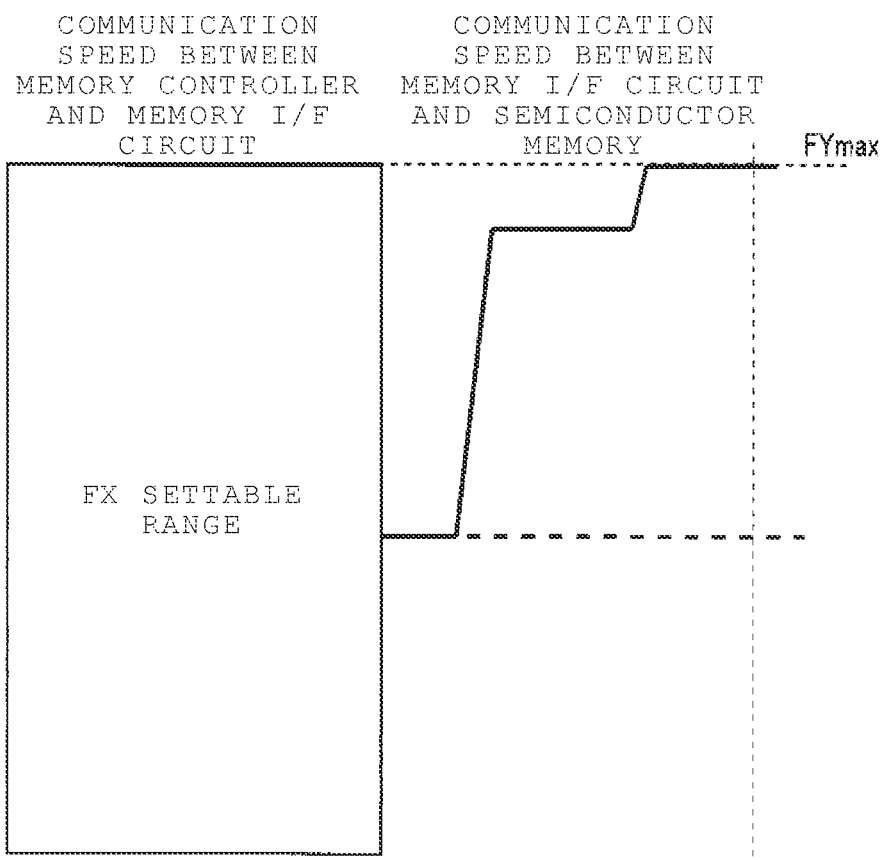
FIG. 20 is a diagram illustrating a change in frequency by frequency multiplication.

FIG. 20 is a diagram illustrating such control described in a scheme similar to that of FIG. 4.

In FIG. 20, the vertical axis represents a communication speed, the left side represents a communication speed between the memory controller 21 and the memory I/F circuit 31, and the right side represents a communication speed between the memory I/F circuit 31 and the semiconductor memory 37.

An initial value of FY is a frequency sufficiently lower than FX used for actual communication. Immediately after starting, FY is set to the initial value. When communication starts, FX is assumed to be changed to FYmax. The control circuit 32 increases FY up to FYmax. Here, the VIC circuit 11 and the OSC 12 have configurations similar to those of FIGS. 18 and 19, and thus the control circuit 32 performs control once such that FY is set to the X/Y multiple. Subsequently, the control circuit 32 increases FY up to FYmax through the trimming process of FIG. 11.

As such, by performing the control of FIG. 12, it is possible to change FY to a desired frequency in a relatively short time even when FY is set to a sufficiently low frequency in the initial state. Thus, it is possible to reduce power consumption and change the frequency in a short time to perform reliable data transfer.

While certain embodiments have been described, the embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
   a first oscillator configured to generate a first signal with a first frequency based on a control signal and output the first signal to a path;
   a control signal generation circuit operatively coupled to the first oscillator via the path, and configured to receive the first signal from the first oscillator via the path and generate the control signal;

a second oscillator configured to generate a second signal with a second frequency based on the control signal and output the second signal to an output terminal outside the path; and a control circuit configured to change a setting of the second oscillator based on setting information for changing the second frequency.

2. The semiconductor integrated circuit according to claim 1, further comprising:

a first current source configured to generate a first current based on the control signal and supply the first current to the first oscillator; and a second current source configured to generate a second current based on the control signal and supply the second current to the second oscillator.

3. The semiconductor integrated circuit according to claim 2, further comprising:

a control circuit configured to change a setting of the second current source or the second oscillator based on setting information for changing the second frequency.

4. The semiconductor integrated circuit according to claim 1, further comprising:

a frequency measurement circuit configured to receive the second signal and a reference signal with a reference frequency and measure a frequency of an input signal;

a control logic circuit configured to obtain setting information for matching the second frequency to the reference frequency based on a measurement result by the frequency measurement circuit; and a control circuit configured to change the second frequency based on the setting information.

5. The semiconductor integrated circuit according to claim 4, further comprising:

a second current source including a plurality of transistors, each generating a current based on the control signal and configured to supply a current of amount generated based on the setting information from the currents generated by the plurality of transistors, wherein the second oscillator includes a plurality of inverters that are cascade-connected, the number of stages of the inverters is configured to be controlled with the setting information, and the control circuit is configured to change a setting of the second current source or the second oscillator based on the setting information.

6. The semiconductor integrated circuit according to claim 5, wherein, based on the setting information, the control circuit is configured to set the currents to be "n" multiples, where n is an integer equal to or greater than 2, and set the number of stages of the inverters to be "n" multiples.

7. A semiconductor storage device comprising:

a memory interface circuit configured to transmit data in synchronization with a clock generated by a clock generation circuit, wherein the clock generation circuit includes: a first oscillator configured to generate a first signal with a first frequency based on a control signal and output the first signal to a path;

a control signal generation circuit operatively coupled to the first oscillator via the path, and configured to receive the first signal from the first oscillator via the path and generate the control signal;

a second oscillator configured to generate a second signal with a second frequency based on the control signal and output the second signal to an output terminal outside the path; and a semiconductor memory configured to receive the data transmitted from the memory interface circuit;

wherein the clock generation circuit further includes a control circuit configured to change a setting of the second oscillator based on setting information for changing the second frequency.

8. The semiconductor storage device according to claim 7, wherein the clock generation circuit further includes:

a first current source configured to generate a first current based on the control signal and supply the first current to the first oscillator; and a second current source configured to generate a second current based on the control signal and supply the second current to the second oscillator.

9. The semiconductor storage device according to claim 7, wherein the clock generation circuit further includes:

a frequency measurement circuit configured to receive the second signal and a reference signal with a reference frequency and measure a frequency of an input signal;

a control logic circuit configured to obtain setting information for matching the second frequency to the reference frequency based on a measurement result by the frequency measurement circuit; and a control circuit configured to change the second frequency based on the setting information.

10. The semiconductor storage device according to claim 9, wherein the clock generation circuit further includes:

a second current source including a plurality of transistors each generating a current based on the control signal and configured to supply a current of amount generated based on the setting information from the currents generated by the plurality of transistors, wherein the second oscillator includes a plurality of inverters that are cascade-connected, the number of stages of the inverters configured to be controlled with the setting information, and the control circuit is configured to change a setting of the second current source or the second oscillator based on the setting information.

11. The semiconductor storage device according to claim 10, wherein, based on the setting information, the control circuit is configured to set the currents to be "n" multiples, where n is an integer equal to or greater than 2, and set the number of stages of the inverters to be "n" multiples.

12. A memory system comprising:

a memory controller configured to transmit data in synchronization with a first clock generated by a first clock generation circuit;

a memory interface circuit configured to transmit data in synchronization with a second clock generated by a second clock generation circuit, wherein the second clock generation circuit includes: a first oscillator configured to generate a first signal with a first frequency based on a control signal and output the first signal to a path; a control signal generation circuit operatively coupled to the first oscillator via the path, and configured to receive the first signal from the first oscillator via the path and generate the control signal; and a second oscillator configured to generate a second signal with a second frequency based on the control signal and output the second signal to an output terminal outside the path; and a semiconductor memory configured to receive the data transmitted from the memory interface circuit;

wherein the second clock generation circuit further includes a control circuit configured to change a setting of the second oscillator based on setting information for changing the second frequency.

13. The memory system according to claim 12, wherein the second clock generation circuit further includes:

a first current source configured to generate a first current based on the control signal and supply the first current to the first oscillator; and a second current source configured to generate a second current based on the control signal and supply the second current to the second oscillator.

14. The memory system according to claim 12, wherein the second clock generation circuit further includes:

a frequency measurement circuit configured to receive the second signal and a reference signal with a reference frequency and measure a frequency of an input signal;

a control logic circuit configured to obtain setting information for matching the second frequency to the reference frequency based on a measurement result by the frequency measurement circuit; and a control circuit configured to change the second frequency based on the setting information.

15. The memory system according to claim 14, wherein the second clock generation circuit further includes:

a second current source including a plurality of transistors each generating a current based on the control signal and configured to supply a current of amount generated based on the setting information from the currents generated by the plurality of transistors, wherein the second oscillator includes a plurality of inverters that are cascade-connected, the number of stages of the inverters configured to be controlled with the setting information, and the control circuit is configured to change a setting of the second current source or the second oscillator based on the setting information.

16. The memory system according to claim 15, wherein, based on the setting information, the control circuit is configured to set the currents to be "n" multiples, where n is an integer equal to or greater than 2, and set the number of stages of the inverters to be "n" multiples.

\* \* \* \* \*